(12) United States Patent
Choi et al.

(10) Patent No.: US 12,414,413 B2
(45) Date of Patent: Sep. 9, 2025

(54) DISPLAY DEVICE

(71) Applicant: Samsung Display Co., LTD., Yongin-si (KR)

(72) Inventors: Hae Yun Choi, Hwaseong-si (KR); Soo Chul Kim, Hwaseong-si (KR); Ok Yi Lee, Seoul (KR); Tae Hee Lee, Hwaseong-si (KR); Joo Woan Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 485 days.

(21) Appl. No.: 17/987,622

(22) Filed: Nov. 15, 2022

(65) Prior Publication Data

US 2023/0163251 A1 May 25, 2023

(30) Foreign Application Priority Data

Nov. 25, 2021 (KR) .................. 10-2021-0164757

(51) Int. Cl.
*H10H 20/851* (2025.01)
*H10H 20/814* (2025.01)
*H10H 20/831* (2025.01)
*H10H 29/14* (2025.01)

(52) U.S. Cl.
CPC ...... *H10H 20/8512* (2025.01); *H10H 20/814* (2025.01); *H10H 20/8312* (2025.01); *H10H 29/142* (2025.01)

(58) Field of Classification Search
CPC .......... H10H 20/8512; H10H 20/8312; H10H 20/814; H10H 29/142
See application file for complete search history.

(56) References Cited

U.S. PATENT DOCUMENTS

| | | | |
|---|---|---|---|
| 2019/0181181 A1* | 6/2019 | Yeon | H01L 25/0753 |
| 2020/0251688 A1* | 8/2020 | Chung | H10K 85/40 |
| 2020/0343229 A1* | 10/2020 | Iguchi | H01L 25/0753 |
| 2020/0343410 A1* | 10/2020 | Iguchi | H10H 20/856 |
| 2021/0005672 A1* | 1/2021 | Lee | H10K 59/38 |

FOREIGN PATENT DOCUMENTS

KR 10-2018-0118488 A 10/2018

* cited by examiner

*Primary Examiner* — Mark W Tornow
(74) *Attorney, Agent, or Firm* — Womble Bond Dickinson (US) LLP

(57) ABSTRACT

A display device includes a substrate; a partition wall on the substrate; a light emitting element extends in a thickness direction of the substrate and is in an emission area of the substrate partitioned by the partition wall; a wavelength conversion layer on the light emitting element and includes a base resin and wavelength conversion particles dispersed in the base resin and being for converting a wavelength of light emitted from the light emitting element; a light blocking member on the partition wall; a reflective member between the light blocking member and the partition wall; and an optical pattern on the wavelength conversion layer in the emission area and having a shape protruding in an upward direction away from the substrate.

20 Claims, 25 Drawing Sheets

DISPLAY DEVICE

CROSS-REFERENCE TO RELATED APPLICATION

This application claims priority to and the benefit of Korean Patent Application No. 10-2021-0164757, filed on Nov. 25, 2021, in the Korean Intellectual Property Office, the content of which are incorporated herein by reference in its entirety.

BACKGROUND

1. Field

Aspects of embodiments of the present disclosure relate to a display device.

2. Description of the Related Art

As the information society develops, the demand for a display device for displaying an image in various forms is increasing. The display device may be a flat panel display, such as a liquid crystal display, a field emission display, or a light emitting display. A light emitting display device may include an organic light emitting display device including an organic light emitting diode element as a light emitting element, an inorganic light emitting display device including an inorganic semiconductor element as a light emitting element, or a micro light emitting display device including a micro light emitting diode element as a light emitting element.

Recently, a head mounted display (HMD) including a light emitting display device has been developed. The head mounted display (HMD) is a glasses-type monitor device for virtual reality (VR) or augmented reality (AR) that is worn by a user in the form of glasses or a helmet and forms a focus at a distance close to and in front of the user's eyes.

A high-resolution micro light emitting diode display panel including a micro light emitting diode element may be applied to the head mounted display. Because the micro light emitting diode element emits light of a single color, the micro light emitting diode display panel may include a wavelength conversion layer for converting a wavelength of the light emitted from the micro light emitting diode element to display various colors.

SUMMARY

Aspects and features of the present disclosure provide a display device having increased light concentration.

However, aspects and features of the present disclosure are not limited to those set forth herein. The above and other aspects and features of the present disclosure will become more apparent to one of ordinary skill in the art to which the present disclosure pertains by referencing the detailed description given below.

According to an embodiment of the present disclosure, a display device includes: a substrate; a partition wall on the substrate; a light emitting element extending in a thickness direction of the substrate and being in an emission area of the substrate that is partitioned by the partition wall; a wavelength conversion layer on the light emitting element in the emission area and including a base resin and wavelength conversion particles dispersed in the base resin and that are configured to convert a wavelength of light emitted from the light emitting element; a light blocking member on the partition wall; a reflective member between the light blocking member and the partition wall; and an optical pattern on the wavelength conversion layer in the emission area. The optical pattern has a shape protruding in an upward direction away from the substrate.

According to another embodiment of the present disclosure, a display device includes: a first emission area for emitting first light, a second emission area for emitting second light, and a third emission area for emitting third light, each of which are in a display area of a substrate; a partition wall partitioning the first emission area, the second emission area, and the third emission area; a first light emitting element in the first emission area, a second light emitting element in the second emission area, and a third light emitting element in the third emission area, each of the first, second, and third light emitting elements extending in a thickness direction of the substrate; a filling layer on the light emitting elements in each of the first emission area, the second emission area, and the third emission area; a light blocking member on the partition wall; a reflective member between the light blocking member and the partition wall; and an optical pattern on the filling layer in the first, second, and third emission areas. The optical pattern has a shape protruding in an upward direction away from the substrate.

Detailed descriptions of other aspects, features, and embodiments are provided in the detailed description and are illustrated in the accompanying drawings.

According to a display device according to embodiments of the present disclosure, a light concentration degree may be improved.

However, the aspects and features of embodiments of the present disclosure are not limited to that described above. The above and other aspects and features of embodiments of the present disclosure will become more apparent to one of ordinary skill in the art to which the present disclosure pertains.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
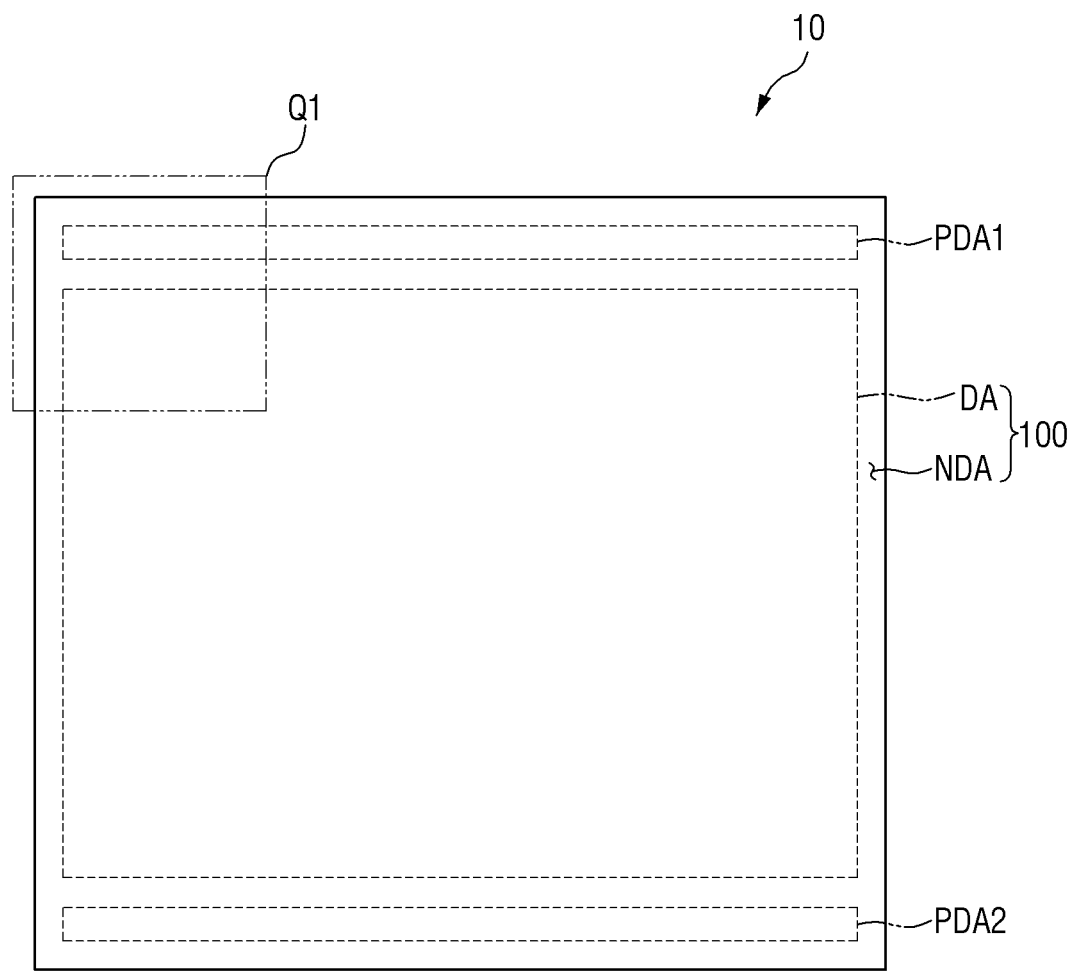
FIG. 1 is a layout view of a display device according to an embodiment.
Figure 1:
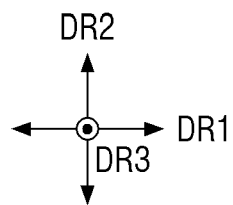

Structural and functional descriptions of embodiments of the present disclosure are only for illustrative purposes describing embodiments of the present disclosure. The present disclosure may be embodied in many different forms without departing from the spirit and scope of the present disclosure as defined by the appended claims and their equivalents. Therefore, embodiments of the present disclosure are described herein for illustrative purposes and should not be construed as limiting the present disclosure. That is, the present disclosure is defined by the scope of the claims and their equivalents.

It will be understood that when an element is referred to as being related to another element, such as being "coupled" or "connected" to another element, it can be directly coupled or connected to the other element or intervening elements may be present therebetween. It should also be understood that when an element is referred to as being directly related to another element, such as being "directly coupled" or "directly connected" to another element, there are no intervening elements present. Other expressions that explain the relationship between elements, such as "on," "directly on," "between," "directly between," "adjacent to," or "directly adjacent to," should be construed in the same way.

Throughout the specification and drawings, the same reference numerals will refer to the same or substantially similar elements.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments and is not intended to be limiting. As used herein, "a," "an," "the," and "at least one" do not denote a limitation of quantity and are intended to include both the singular and plural unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes," and/or "including" when used in this specification, specify the presence of stated features, regions, integers, steps, operations, elements, and/or components but do not preclude the presence or addition of one or more other features, regions, integers, steps, operations, elements, components, and/or groups thereof.

Furthermore, relative terms, such as "lower" or "bottom" and "upper" or "top" may be used herein to describe one element's relationship to another element as illustrated in the drawings. It will be understood that relative terms are intended to encompass different orientations of the device in addition to the orientation depicted in the drawings. For example, if the device in one of the drawings is turned over, elements described as being on the "lower" side of other elements would then be oriented on "upper" sides of the other elements. The term "lower" can, therefore, encompasses both an orientation of "lower" and "upper" depending on the particular orientation of the drawing. Similarly, if the device in one of the figures is turned over, elements described as "below" or "beneath" other elements would then be oriented "above" the other elements. The terms "below" or "beneath" can, therefore, encompass both an orientation of above and below.

"About," "approximately," or "substantially" as used herein are inclusive of the stated value and values within an acceptable range of deviation for the particular value as determined by one of ordinary skill in the art considering the measurement in question and the error associated with measurement of the particular quantity (e.g., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure and should not be interpreted in an idealized or overly formal sense unless expressly so defined herein.

Embodiments are described herein with reference to cross sectional illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

Figure 2:
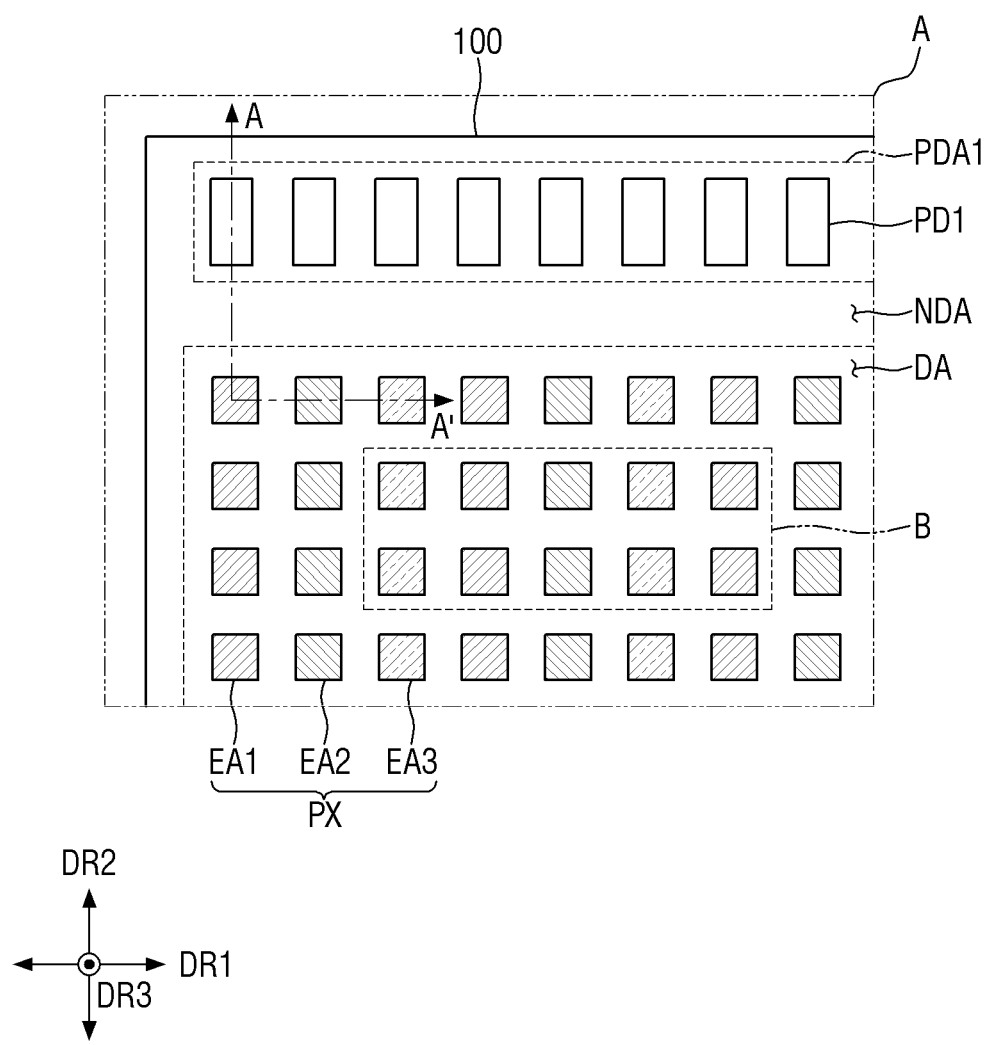
FIG. 2 is a layout view of the region A of FIG. 1.
Figure 3:
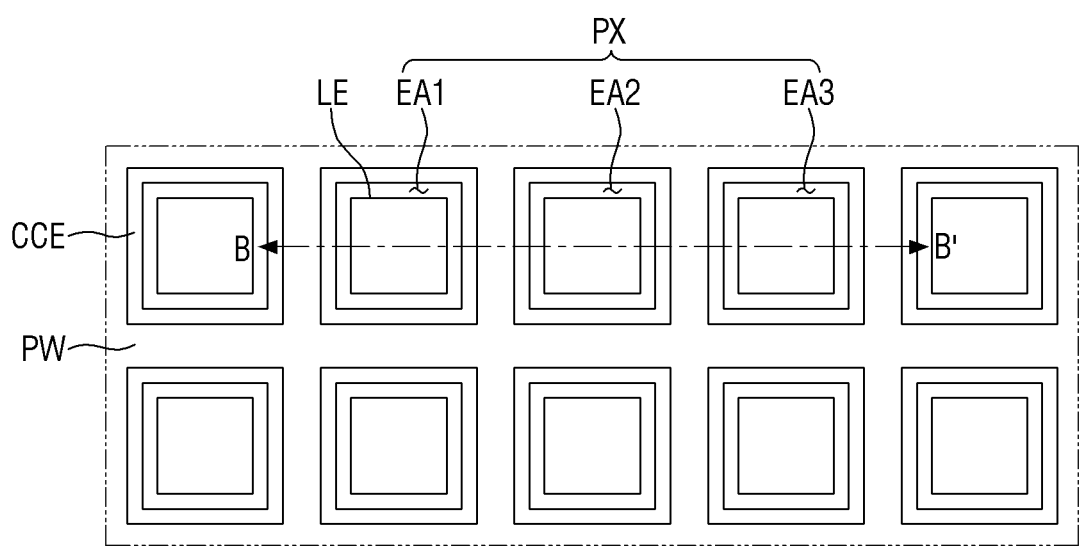
FIG. 3 is a layout view of pixels of a display panel according to an embodiment.

FIG. 1 is a layout view of a display device according to an embodiment, FIG. 2 is a layout view of the region A of FIG. 1, and FIG. 3 is a layout view of pixels of a display panel according to an embodiment. FIG. 3 is an enlarged view of the region B of FIG. 2.

FIGS. 1 to 3 show a display device, according to an embodiment, that is a micro light emitting diode display device including a micro light emitting diode as a light emitting element, but embodiments of the present disclosure are not limited thereto.

In addition, the display device shown in FIGS. 1 and 3 is a Light Emitting Diode on Silicon (LEDoS) display device in which light emitting diode elements are disposed on a semiconductor circuit substrate 110 formed by using a semiconductor process, but embodiments of the present disclosure are not limited thereto.

In addition, in FIGS. 1 to 3, a first direction DR1 refers to a horizontal direction of a display panel 100, a second direction DR2 refers to a vertical direction of the display panel 100, and a third direction (or referred to as "an upward direction") DR3 refers to a thickness direction of the display panel 100 or a thickness direction of the semiconductor circuit substrate 110. Thus, "left", "right", "upper", and "lower" refer to directions when the display panel 100 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2. In addition, "upper portion" refers to one side in the third direction DR3, and "lower portion" refers to the other side in the third direction DR3.

Referring to FIGS. 1 to 3, a display device 10 according to an embodiment includes a display panel 100 having a display area DA and a non-display area NDA.

The display panel 100 may have a rectangular shape, in a plan view, having a long side in the first direction DR1 and a short side in the second direction DR2. However, the shape of the display panel 100 in a plan view is not limited thereto and may have a polygonal, circular, elliptical, or irregular shape in a plan view other than the rectangular shape.

The display area DA may be an area in which an image is displayed, and the non-display area NDA may be an area in which an image is not displayed. A shape of the display area DA in a plan view may follow the shape of the display panel 100 in a plan view. The display area DA of the embodiment shown in FIG. 1 has the rectangular shape in a plan view. The display area DA may be disposed in a central area of the display panel 100. The non-display area NDA may be disposed around the display area DA. The non-display area NDA may be disposed to surround (e.g., to extend around a periphery of) the display area DA.

The display area DA of the display panel 100 may include a plurality of pixels PX. The pixel PX may be defined as a minimum light emitting unit capable of displaying light (e.g., white light).

Each of the plurality of pixels PX may have a plurality of emission areas EA1, EA2, and EA3 for emitting light. Each of the plurality of pixels PX is illustrated as having three emission areas EA1, EA2, and EA3, but the present disclosure is not limited thereto. For example, each of the plurality of pixels PX may have four emission areas.

Each of the plurality of emission areas EA1, EA2, and EA3 may include a light emitting element LE for emitting first light. The light emitting element LE is illustrated as having a rectangular shape in a plan view, but embodiments of the present disclosure are not limited thereto. For example, the light emitting element LE may have a polygonal, circular, elliptical, or irregular shape other than the rectangular shape.

Each of the first emission areas EA1 refers to an area emitting first light. Each of the first emission areas EA1 may output the first light output from the light emitting element LE as it is (e.g., without wavelength conversion). The first light may be light of a blue wavelength band. The blue wavelength band may be in a range of about 370 nm to about 460 nm, but embodiments of the present disclosure are not limited thereto.

Each of the second emission areas EA2 refers to an area emitting second light. Each of the second emission areas EA2 may convert a portion of the first light output from the light emitting element LE into the second light and output the converted second light. The second light may be light of a green wavelength band. The green wavelength band may be in a range of about 480 nm to about 560 nm, but embodiments of the present disclosure are not limited thereto.

Each of the third emission areas EA3 refers to an area emitting third light. Each of the third emission areas EA3 may convert a portion of the first light output from the light emitting element LE into the third light and output the converted third light. The third light may be light of a red wavelength band. The red wavelength band may be in a range of about 600 nm to about 750 nm, but embodiments of the present disclosure are not limited thereto.

The first emission areas EA1, the second emission areas EA2, and the third emission areas EA3 may be alternately arranged in the first direction DR1. For example, the first emission areas EA1, the second emission areas EA2, and the third emission areas EA3 may be disposed in the order of the first emission area EA1, the second emission area EA2, and the third emission area EA3 in the first direction DR1.

The first emission areas EA1 may be arranged in (e.g., may be arranged in columns in) the second direction DR2. The second emission areas EA2 may be arranged in (e.g., may be arranged in columns in) the second direction DR2. The third emission areas EA3 may be arranged in (e.g., may be arranged in columns in) the second direction DR2.

The plurality of emission areas EA1, EA2, and EA3 may be partitioned by a partition wall PW. The partition wall PW may be disposed to surround (e.g., to extend around a periphery of) the light emitting element LE. The partition wall PW may be disposed to be spaced apart from the light emitting element LE. The partition wall PW may have a mesh shape, a net shape, or a lattice shape in a plan view.

The embodiments illustrated in FIGS. 2 and 3 show that each of the plurality of emission areas EA1, EA2, and EA3 defined by the partition wall PW has the rectangular shape in a plan view, but embodiments of the present disclosure are not limited thereto. For example, each of the plurality of emission areas EA1, EA2, and EA3 defined by the partition wall PW may have a polygonal, circular, elliptical, or irregular shape other than the rectangular shape.

A common connection electrode CCE may be disposed to overlap the partition wall PW in the third direction DR3. The common connection electrode CCE may be disposed to surround (e.g., to extend around a periphery of) the light emitting element LE. The common connection electrode CCE may be disposed to be spaced apart from the light emitting element LE. The common connection electrode CCE may have a mesh shape, a net shape, or a lattice shape in a plan view.

A width Wcce of the common connection electrode CCE in the first direction DR1 or the second direction DR2 may be wider than a width Wpw of the partition wall PW. The partition wall PW may completely overlap the common connection electrode CCE in the third direction DR3 (see, e.g., FIG. 5). A portion of the common connection electrode CCE may overlap the partition wall PW in the third direction DR3.

The non-display area NDA may include a first pad portion PDA1 and a second pad portion PDA2.

The first pad portion PDA1 may be disposed in the non-display area NDA. The first pad portion PDA1 may be disposed above (e.g., above in the second direction DR2) the display panel 100. The first pad portion PDA1 may include first pads PD1 connected to an external circuit board (e.g., CB in FIG. 4).

The second pad portion PDA2 may be disposed in the non-display area NDA. The second pad portion PDA2 may be disposed on a lower side of the semiconductor circuit substrate 110. The second pad portion PDA2 may include second pads to be connected to the external circuit board (e.g., CB in FIG. 4). In some embodiments, the second pad portion PDA2 may be omitted.

Figure 4:
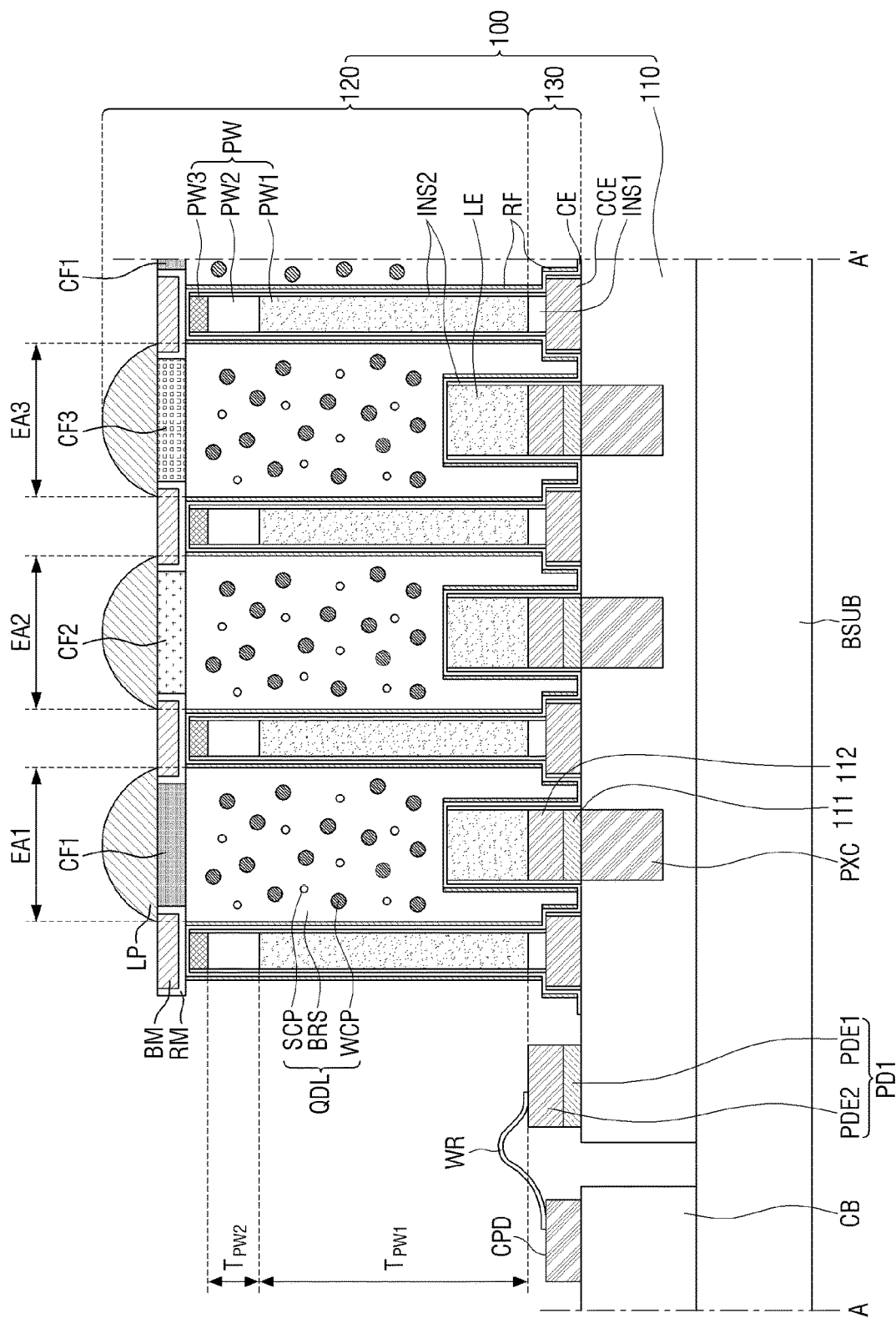
FIG. 4 is a cross-sectional view of the display panel taken along the line A-A' of FIG. 2.
Figure 5:
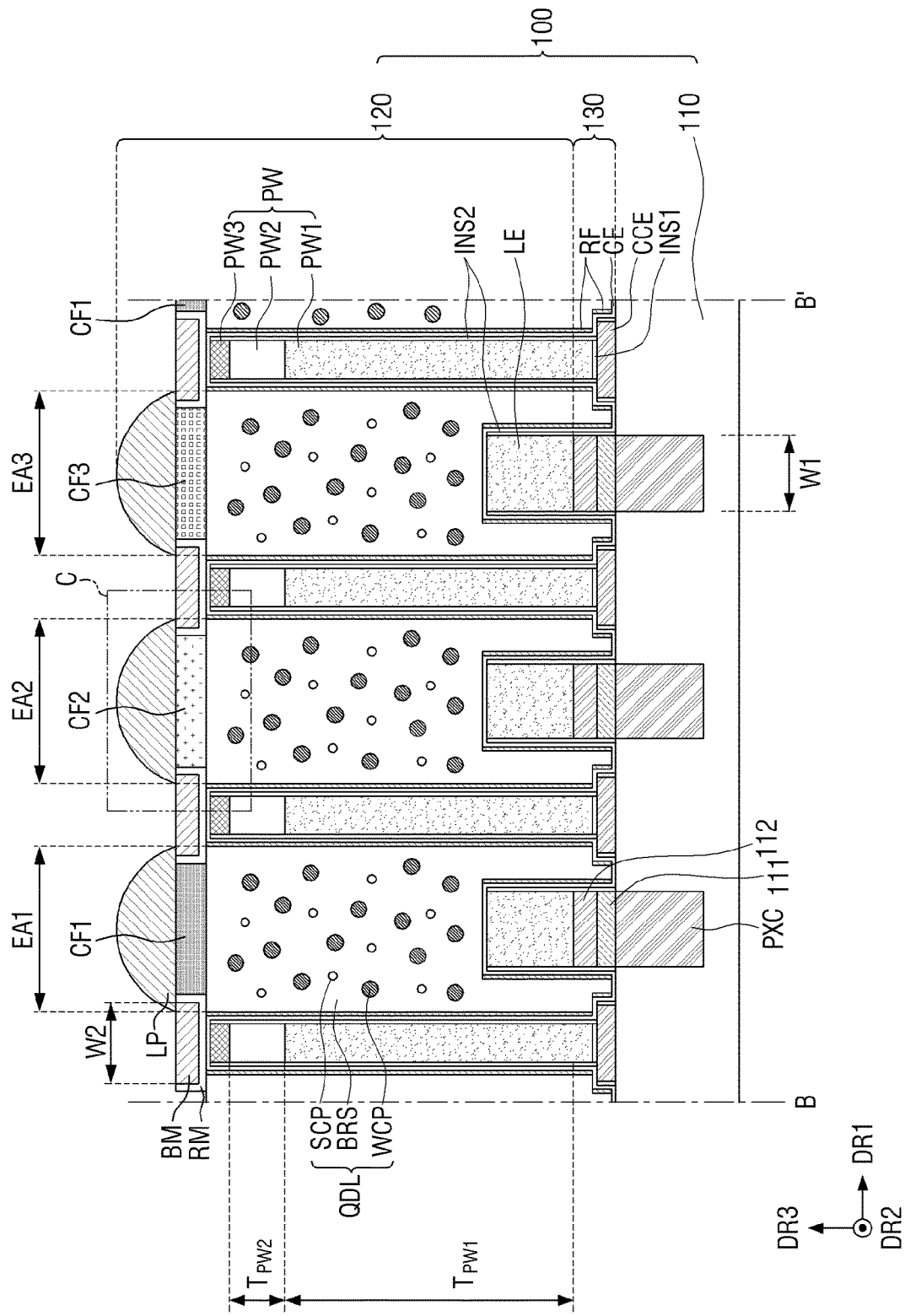
FIG. 5 is a cross-sectional view of the display panel taken along the line B-B' of FIG. 3.
Figure 6:
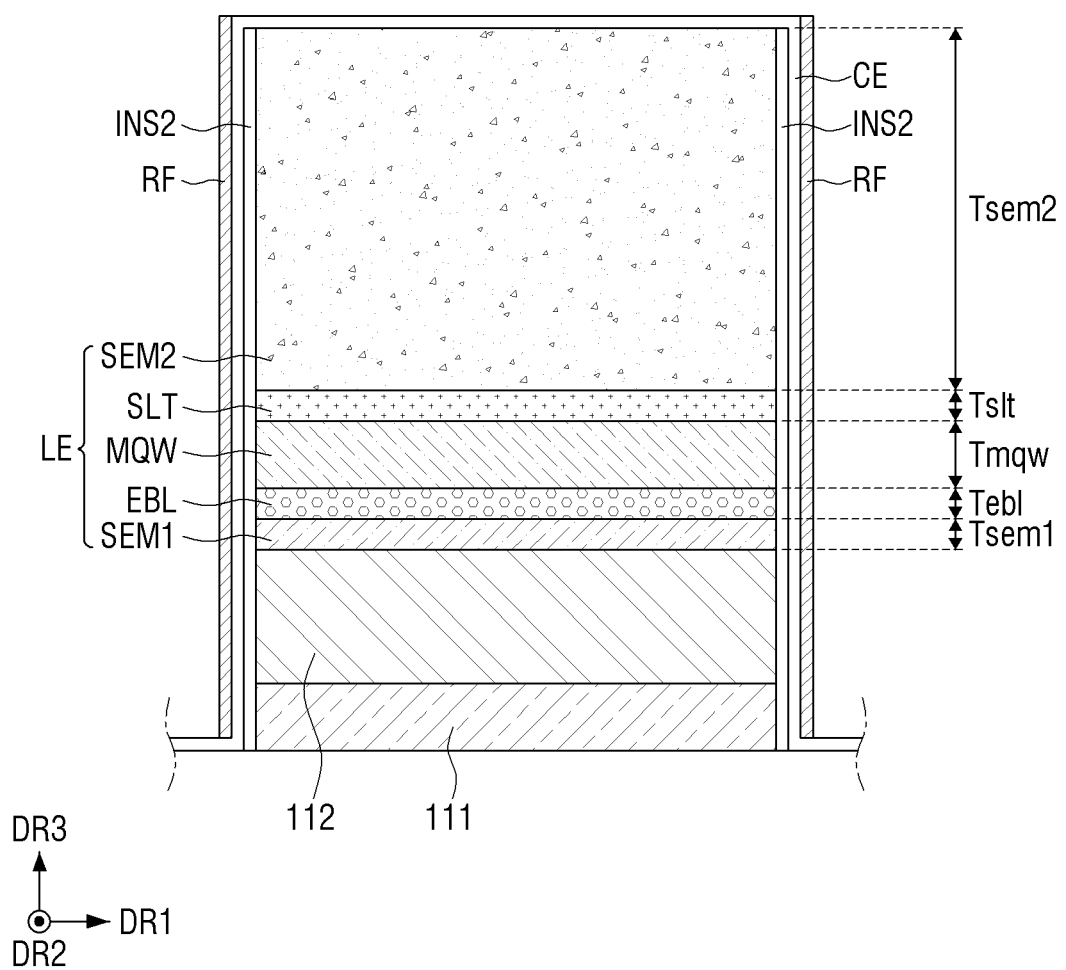
FIG. 6 is an enlarged cross-sectional view of a light emitting element shown in FIG. 5.
Figure 7:
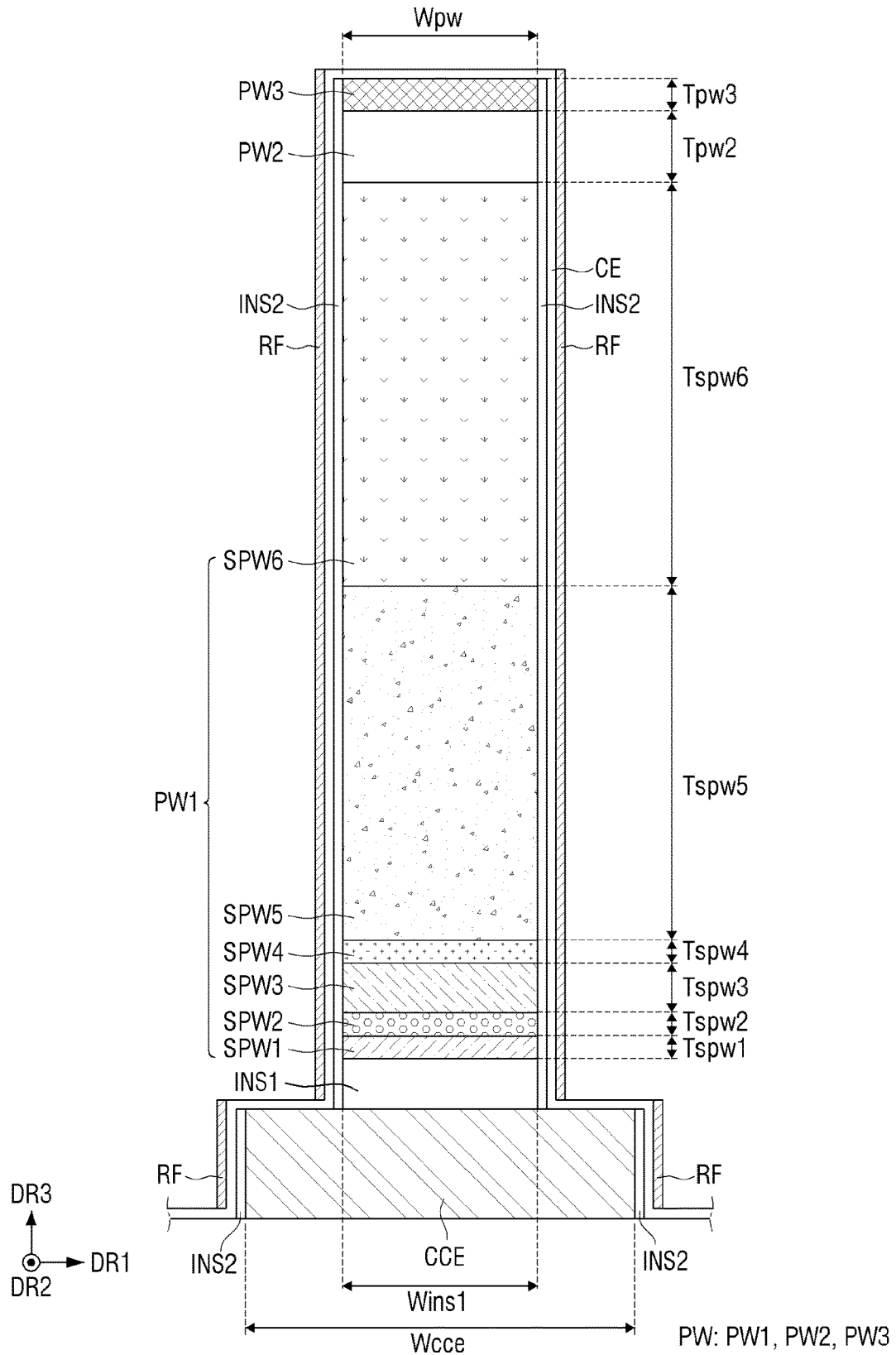
FIG. 7 is an enlarged cross-sectional view of a partition wall shown in FIG. 5.

FIG. 4 is a cross-sectional view of the display panel taken along the line A-A' of FIG. 2, FIG. 5 is a cross-sectional view of the display panel taken along the line B-B' of FIG. 4, FIG. 6 is an enlarged cross-sectional view of a light emitting element shown in FIG. 5, and FIG. 7 is an enlarged cross-sectional view of a partition wall shown in FIG. 5.

Referring to FIGS. 4 to 7, the display panel 100 may include the semiconductor circuit substrate 110, a conductive connection layer 130, and a light emitting element layer 120.

The semiconductor circuit substrate 110 may include a plurality of pixel circuit portions PXC. The conductive connection layer 130 may include pixel electrodes 111, connection electrodes 112, first pads PD1, the common connection electrode CCE, and a first insulating layer INS1.

The semiconductor circuit substrate 110 may be a silicon wafer substrate formed by using a semiconductor process. The plurality of pixel circuit portions PXC of the semiconductor circuit substrate 110 may be formed by using a semiconductor process.

The plurality of pixel circuit portions PXC may be disposed in the display area (e.g., DA in FIG. 2). Each of the plurality of pixel circuit portions PXC may be connected to the pixel electrode 111 corresponding thereto. For example, the plurality of pixel circuit portions PXC and the plurality of pixel electrodes 111 may be connected to each other to correspond to each other in a one-to-one manner. Each of the plurality of pixel circuit portions PXC may overlap the light emitting element LE in the third direction DR3.

Each of the plurality of pixel circuit portions PXC may include at least one transistor formed by a semiconductor process. In addition, each of the plurality of pixel circuit portions PXC may further include at least one capacitor formed by a semiconductor process. Each of the plurality of pixel circuit portions PXC may apply a pixel voltage or an anode voltage to the pixel electrode 111.

Each of the plurality of pixel electrodes 111 may be disposed on the pixel circuit portion PXC corresponding thereto. Each of the pixel electrodes 111 may be an exposed electrode exposed from the pixel circuit portion PXC. For example, each of the pixel electrodes 111 may protrude from a top surface of the pixel circuit portion PXC. Each of the pixel electrodes 111 may be formed integrally with the pixel circuit portion PXC. Each of the pixel electrodes 111 may receive the pixel voltage or the anode voltage applied from the pixel circuit portion PXC. The pixel electrodes 111 may be formed of aluminum (Al).

Each of the connection electrodes 112 may be disposed on the pixel electrode 111 corresponding thereto. Each of the connection electrodes 112 may be disposed on the pixel electrode 111. The connection electrodes 112 may include a metal material for adhering the pixel electrodes 111 to the light emitting elements LE. For example, the connection electrodes 112 may include at least one of gold (Au), copper (Cu), aluminum (Al), and tin (Sn). In some embodiments, the connection electrodes 112 may include a first layer including any one of gold (Au), copper (Cu), aluminum (Al), and tin (Sn) and a second layer including another one of gold (Au), copper (Cu), aluminum (Al), and tin (Sn). In such an embodiment, the second layer may be disposed on the first layer.

The common connection electrode CCE may be disposed to be spaced apart from the pixel electrode 111 and the connection electrode 112. The common connection electrode CCE may be disposed to surround the pixel electrode 111 and the connection electrode 112.

The common connection electrode CCE may be connected to any one of the first pads PD1 in the first pad portion PDA1 of the non-display area NDA or any one of the second pads PD2 in the second pad portion PDA2 to receive a common voltage. The common connection electrode CCE may include the same material as the connection electrodes 112. For example, the common connection electrode CCE may include at least one of gold (Au), copper (Cu), aluminum (Al), and tin (Sn). When each of the connection electrodes 112 includes the first layer and the second layer, the common connection electrode CCE may include the same material as the first layer of each of the connection electrodes 112.

A first insulating layer INS1 may be disposed on the common connection electrode CCE. The first insulating layer INS1 may be formed of an inorganic layer, such as a silicon oxide layer ($SiO_2$), an aluminum oxide layer ($Al_2O_3$), or a hafnium oxide layer ($HfO_x$). A width Wins1 of the first insulating layer INS1 in the first direction DR1 or the second direction DR2 may be smaller than a width Wcce of the common connection electrode CCE. Accordingly, a portion of the top surface of the common connection electrode CCE may be exposed without being covered by the first insulating layer INS1. The portion of the top surface of the common connection electrode CCE that is exposed without being covered by the first insulating layer INS1 may be in contact with the common electrode CE. Therefore, the common electrode CE may be connected to the common connection electrode CCE.

Each of the first pads PD1 may be connected to a pad CPD of the circuit board CB through a conductive connection member, such as a wire WR corresponding thereto. For example, the first pads PD1, the wires WR, and the pads CPD of the circuit board CB may be connected to each other in a one-to-one manner.

Each of the first pads PD1 may include a first pad electrode PDE1 and a second pad electrode PDE2. The first pad electrode PDE1 may include the same material as the pixel electrode 111. The second pad electrode PDE2 may include the same material as the connection electrodes 112. For example, the second pad electrode PDE2 may include at least one of gold (Au), copper (Cu), aluminum (Al), and tin (Sn). When each of the connection electrodes 112 includes the first layer and the second layer, the second pad electrode PDE2 may also include the first layer and the second layer.

The semiconductor circuit substrate 110 and the circuit board CB may be disposed on a base substrate BSUB. The semiconductor circuit substrate 110 and the circuit board CB may be attached to the top surface of the base substrate BSUB by using an adhesive member, such as a pressure sensitive adhesive.

The circuit board CB may be a flexible film, such as a flexible printed circuit board (FPCB), a printed circuit board (PCB), a flexible printed circuit (FPC), or a chip on film (COF).

The second pads of the second pad portion PDA2 may be substantially the same as the first pads PD1 described with reference to, for example, FIG. 4. Thus, a description of the second pads of the second pad portion PDA2 will be omitted.

The light emitting element layer 120 may include light emitting elements LE, the partition wall PW, a second insulating layer INS2, the common electrode CE, a reflective film RF, a passivation film, a wavelength conversion layer QDL, a plurality of color filters CF1, CF2, and CF3, a light blocking member BM, a reflective member RM, and optical patterns LP.

The light emitting element layer 120 may have the first emission areas EA1, second emission areas EA2, and third emission areas EA3 partitioned by the partition wall PW. Any one of the light emitting element LE, the passivation film, the wavelength conversion layer QDL, the plurality of color filters CF1, CF2, and CF3, and the optical pattern LP may be disposed in each of the first emission areas EA1, the second emission areas EA2, and the third emission areas EA3.

The light emitting element LE may be disposed on the connection electrode 112 in each of the first emission areas EA1, the second emission areas EA2, and the third emission areas EA3. The light emitting element LE may be a vertical light emitting diode element extending in the third direction DR3. For example, a length of the light emitting element LE in the third direction DR3 may be greater than a length of the light emitting element LE in a horizontal direction. The length in the horizontal direction refers to a length in the first direction DR1 or a length in the second direction DR2. For example, the length of the light emitting element LE in the third direction DR3 may be in a range of about 1 μm to about 5 μm.

The light emitting element LE may be a micro light emitting diode element. The light emitting element LE includes a first semiconductor layer SEM1, an electron blocking layer EBL, an active layer MQW, a superlattice layer SLT, and a second semiconductor layer SEM2 in the third direction DR3 as illustrated in, for example, FIG. 6. The first semiconductor layer SEM1, the electron blocking layer EBL, the active layer MQW, the superlattice layer SLT, and the second semiconductor layer SEM2 may be sequentially stacked in the third direction DR3.

The first semiconductor layer SEM1 may be disposed on the connection electrode 112. The first semiconductor layer SEM1 may be doped with a first conductivity-type dopant, such as Mg, Zn, Ca, Sr, or Ba. For example, the first semiconductor layer SEM1 may be made of p-GaN doped with p-type Mg. A thickness of the first semiconductor layer SEM1 may be in a range of about 30 nm to about 200 nm.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be made of p-AlGaN doped with p-type Mg. A thickness of the electron blocking layer EBL may be in a range of about 10 nm to about 50 nm. In some embodiments, the electron blocking layer EBL may be omitted.

The active layer MQW may be disposed on the electron blocking layer EBL. The active layer MQW may emit light by a recombination of electron-hole pairs according to electrical signals applied through the first semiconductor layer SEM1 and the second semiconductor layer SEM2. The active layer MQW may emit first light having a central wavelength band in the range of about 450 nm to about 495 nm, that is, light of a blue wavelength band.

The active layer MQW may include a material having a single or multiple quantum well structure. When the active layer MQW includes the material having the multiple quantum well structure, the active layer MQW may also have a structure in which a plurality of well layers and barrier layers are alternately stacked. In such an embodiment, the well layer may be made of InGaN and the barrier layer may be made of GaN or AlGaN, but the present disclosure is not limited thereto. A thickness of the well layer may be in a range of about 1 nm to about 4 nm, and a thickness of the barrier layer may be in a range of about 3 nm to about 10 nm.

In some embodiments, the active layer MQW may have a structure in which semiconductor materials having large energy band gap and semiconductor materials having small energy band gap are alternately stacked and may include other Group III to Group V semiconductor materials according to a wavelength band of emitted light. The light emitted by the active layer MQW is not limited to the first light (e.g., light of a blue wavelength band), and in some embodiments, the active layer MQW may also emit second light (e.g., light of a green wavelength band) or third light (e.g., light of a red wavelength band).

The superlattice layer SLT may be disposed on the active layer MQW. The superlattice layer SLT may be a layer for alleviating stress between the second semiconductor layer SEM2 and the active layer MQW. For example, the superlattice layer SLT may be formed of InGaN or GaN. A thickness of the superlattice layer SLT may be in a range of about 50 nm to about 200 nm. In some embodiments, the superlattice layer SLT may be omitted.

The second semiconductor layer SEM2 may be disposed on the superlattice layer SLT. The second semiconductor layer SEM2 may be doped with a second conductivity-type dopant, such as Si, Ge, Se, or Sn. For example, the second semiconductor layer SEM2 may be made of n-GaN doped with n-type Si. A thickness of the second semiconductor layer SEM2 may be in a range of about 2 μm to about 4 μm.

The light emitting element LE may have a first width W1 in the first direction DR1.

The partition wall PW may be disposed to be spaced apart from the light emitting element LE disposed in each of the first emission areas EA1, the second emission areas EA2, and the third emission areas EA3. The partition wall PW may be disposed to surround (e.g., to extend around a periphery of) the light emitting element LE disposed in each of the first emission areas EA1, the second emission areas EA2, and the third emission areas EA3.

The partition wall PW may be disposed on the common connection electrodes CCE. The width Wpw of the partition wall PW in the first direction DR1 and the second direction DR2 may be smaller than the width Wcce of the common connection electrode CCE. The partition wall PW may be disposed to be spaced apart from the light emitting elements LE.

The partition wall PW may include a first partition wall PW1, a second partition wall PW2, and a third partition wall PW3.

The first partition wall PW1 may be disposed on the first insulating layer INS1. Because the first partition wall PW1 is formed by the same process as that of the light emitting element LE, at least a portion of the first partition wall PW1 may include the same material as that of the light emitting element LE.

The first partition wall PW1 may include a plurality of sub partition walls SPW1 to SPW6 sequentially stacked in the third direction DR3. For example, the first partition wall PW1 may include a first sub partition wall SPW1, a second sub partition wall SPW2, a third sub partition wall SPW3, a fourth sub partition wall SPW4, a fifth sub partition wall SPW5, and a sixth sub partition wall SPW6.

The first sub partition wall SPW1 may be formed of the same material as the first semiconductor layer SEM1 of the light emitting element LE. The first sub partition wall SPW1 may be formed by the same process as that of the first semiconductor layer SEM1 of the light emitting element LE. A thickness Tspw1 of the first sub partition wall SPW1 may be substantially the same as a thickness Tsem1 of the first semiconductor layer SEM1 of the light emitting element LE.

The second sub partition wall SPW2 may be formed of the same material as that of the electron blocking layer EBL of the light emitting element LE. The second sub partition wall SPW2 may be formed by the same process as that of the electron blocking layer EBL of the light emitting element LE. A thickness Tspw2 of the second sub partition wall SPW2 may be substantially the same as a thickness Tebl of the electron blocking layer EBL of the light emitting element LE. In an embodiment in which the electron blocking layer EBL is omitted, the second sub partition wall SPW2 may also be omitted.

The third sub partition wall SPW3 may be formed of the same material as that of the active layer MQW of the light emitting element LE. The third sub partition wall SPW3 may be formed by the same process as that of the active layer MQW of the light emitting element LE. A thickness Tspw3 of the third sub partition wall SPW3 may be substantially the same as a thickness Tmqw of the active layer MQW of the light emitting element LE.

The fourth sub partition wall SPW4 may be formed of the same material as that of the superlattice layer SLT of the light emitting element LE. The fourth sub partition wall SPW4 may be formed by the same process as that of the superlattice layer SLT of the light emitting element LE. A thickness Tspw4 of the fourth sub partition wall SPW4 may be substantially the same as a thickness Tslt of the superlattice layer SLT of the light emitting element LE.

The fifth sub partition wall SPW5 may be formed of the same material as that of the second semiconductor layer SEM2 of the light emitting element LE. The fifth sub partition wall SPW5 may be formed by the same process as that of the second semiconductor layer SEM2 of the light emitting element LE. Because the fifth sub partition wall SPW5 is not removed even though a portion of the second semiconductor layer SEM2 of the light emitting element LE is removed in the manufacturing process of the display panel 100, a thickness Tspw5 of the fifth sub partition wall SPW5 may be greater than a thickness Tsem2 of the second semiconductor layer SEM2 of the light emitting element LE.

The sixth sub partition wall SPW6 may be formed of a semiconductor layer that is not doped with a dopant, that is, an undoped semiconductor layer. For example, the sixth sub partition wall SPW6 may be made of GaN that is not doped with a dopant. A thickness Tspw6 of the sixth sub partition wall SPW6 may be greater than the thickness Tsem2 of the second semiconductor layer SEM2 of the light emitting element LE. The thickness Tspw6 of the sixth sub partition wall SPW6 may be in a range of about 2 μm to about 3 μm.

The second partition wall PW2 and the third partition wall PW3 may act as a mask preventing the first partition wall PW1 from being etched in a manufacturing process for forming the light emitting element LE and the partition wall PW.

The second partition wall PW2 may be disposed on the first partition wall PW1. The second partition wall PW2 may be formed of an inorganic layer, such as a silicon oxide layer ($SiO_2$), an aluminum oxide layer ($Al_2O_3$), or a hafnium oxide layer ($HfO_x$). A thickness Tpw2 of the second partition wall PW2 may be in a range of about 1 μm to about 2 μm.

The third partition wall PW3 may be disposed on the second partition wall PW2. The third partition wall PW3 may include a conductive material, such as nickel (Ni). A thickness Tpw3 of the third partition wall PW3 may be in a range of about 0.01 μm to about 1 μm. Furthermore, a thickness Tpw1 of the first partition wall PW1 may be greater than the thickness Tpw2 of the second partition wall PW2 and the thickness Tpw3 of the third partition wall PW3.

The second insulating layer INS2 may be disposed on side surfaces of the common connection electrode CCE, side surfaces of the partition wall PW, side surfaces of each of the pixel electrodes 111, side surfaces of each of the connection electrodes 112, and side surfaces of each of the light emitting elements LE. The second insulating layer INS2 may be formed of an inorganic layer, such as a silicon oxide layer ($SiO_2$), an aluminum oxide layer ($Al_2O_3$), or a hafnium oxide layer ($HfO_x$). A thickness of the second insulating layer INS2 may be approximately 0.1 μm.

The common electrode CE may be disposed on the top surface and the side surfaces of each of the light emitting elements LE and the top surface and the side surfaces of the partition wall PW. For example, the common electrode CE may be disposed to cover the top surface and the side surfaces of each of the light emitting elements LE and the top surface and the side surfaces of the partition wall PW.

The common electrode CE may be in contact with the second insulating layer INS2 disposed on the side surfaces of the common connection electrode CCE, the side surfaces of the partition wall PW, the side surfaces of each of the pixel electrodes 111, the side surfaces of each of the connection electrodes 112, and the side surfaces of each of the light emitting elements LE. In addition, the common electrode CE may be in contact with the top surface of the common connection electrode CCE, the top surface of each of the light emitting elements LE, and the top surface of the partition wall PW.

The common electrode CE may be in contact with the top surface of the common connection electrode CCE and the top surface of the light emitting element LE, which are exposed by (e.g., which are not covered by) the second insulating layer INS2. Therefore, a common voltage supplied to the common connection electrode CCE may be applied to the light emitting element LE. For example, one end of the light emitting element LE may receive a pixel voltage or an anode voltage of the pixel electrode 111 supplied through the connection electrode 112, and the other end thereof may receive the common voltage supplied through the common electrode CE. The light emitting element LE may emit light with a luminance (e.g., a predetermined luminance) according to a voltage difference between the pixel voltage and the common voltage.

The common electrode CE may include a transparent conductive material. The common electrode CE may be formed of transparent conductive oxide (TCO), such as indium tin oxide (ITO) or indium zinc oxide (IZO). A thickness of the common electrode CE may be approximately 0.1 μm.

The reflective film RF reflects the light traveling in left and right side directions, not in an upward direction, from among the light emitted from the light emitting element LE. The reflective film RF may include a metal material having high reflectivity, such as aluminum (Al). A thickness of the reflective film RF may be approximately 0.1 μm.

The reflective film RF may be disposed on the side surfaces of the common connection electrode CCE, the side surfaces of the partition wall PW, the side surfaces of each of the pixel electrodes 111, the side surfaces of each of the connection electrodes 112, and the side surfaces of each of the light emitting elements LE. The reflective film RF may be in contact with the common electrode CE disposed on the side surfaces of the common connection electrode CCE, the side surfaces of the partition wall PW, the side surfaces of each of the pixel electrodes 111, the side surfaces of each of the connection electrodes 112, and the side surfaces of each of the light emitting elements LE.

The wavelength conversion layer QDL may be disposed on the passivation film in each of the first emission areas EA1, the second emission areas EA2, and the third emission areas EA3. The wavelength conversion layer QDL may convert a portion of the first light incident from the light emitting element LE into fourth light and emit the fourth light. For example, the fourth light may be light of a yellow wavelength band. The fourth light may be light including both a green wavelength band and a red wavelength band. That is, the fourth light may be a mixture of the second light and the third light.

The wavelength conversion layer QDL may include a base resin BRS and a wavelength conversion particle WCP. The base resin BRS may include a light-transmitting organic material. For example, the base resin BRS may include an epoxy-based resin, an acrylic-based resin, a cardo-based resin, an imide-based resin, or the like.

The wavelength conversion particle WCP may convert the first light incident from the light emitting element LE into the fourth light. For example, the wavelength conversion particle WCP may convert light of a blue wavelength band into light of a yellow wavelength band. The wavelength conversion particle WCP may be a quantum dot (QD), a quantum rod, a fluorescent material, or a phosphorescent material. The quantum dot may include group IV nanocrystals, group II-VI compound nanocrystals, group III-V compound nanocrystals, group IV-VI compound nanocrystals, or combinations thereof.

The quantum dot may include a core and a shell overcoating the core. The core may include, for example, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge, but is not limited thereto. The shell may include, for example, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TIAs, TISb, PbS, PbSe, and PbTe but is not limited thereto.

The wavelength conversion layer QDL may further include scatterers SCP for scattering the light emitted from the light emitting element LE in a random direction. The scatterers SCP may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic-based resin or a urethane-based resin. The scatterers SCP may have a diameter of several to several tens of nanometers.

The reflective member RM may be disposed on the partition wall PW. The reflective member RM may be disposed between the light blocking member BM and the partition wall PW. The reflective member RM may be disposed between the common electrode CE and the light blocking member BM and between the reflective film RF and the light blocking member BM. The reflective member RM may be interposed between the common electrode CE and the light blocking member BM to be in direct contact with the common electrode CE and the light blocking member BM and may be interposed between the reflective film RF and the light blocking member BM to be in direct contact with the reflective film RF and the light blocking member BM. The reflective member RM may be disposed to be further extended into the emission areas EA1, EA2, and EA3. For example, a portion of the reflective member RM may be disposed in the emission areas EA1, EA2, and EA3. The reflective member RM may include a metal material having high reflectivity, such as aluminum (Al). For example, the reflective member RM may include the same material as the aforementioned reflective film RF but is not limited thereto. The reflective member RM will be described in more detail later.

The light blocking member BM may be disposed on the reflective member RM. The light blocking member BM may include a light blocking material. For example, the light blocking member BM may include an organic material or a metal material capable of blocking light but is not limited thereto. The light blocking member BM may be disposed between the emission areas EA1, EA2, and EA3 adjacent to each other to prevent color mixing between lights of different wavelength bands emitted from the light emitting elements LE of each of the emission areas EA1, EA2, and EA3. In addition, the light blocking member BM may absorb at least a portion of external light incident on the light emitting element layer 120 from the outside to reduce reflection of external light. The light blocking member BM may be positioned on the partition wall PW and disposed to be further extended into the emission areas EA1, EA2, and EA3. For example, a width W2 of the light blocking member BM may be greater than a width Wpw of the partition wall PW.

The plurality of color filters CF1, CF2, and CF3 may include first color filters CF1, second color filters CF2, and third color filters CF3.

Each of the first color filters CF1 may be disposed on the wavelength conversion layer QDL in the first emission area EA1. Each of the first color filters CF1 may transmit the first light and absorb or block the fourth light. For example, each of the first color filters CF1 may transmit light of a blue wavelength band and may absorb or block light of green and red wavelength bands. Therefore, each of the first color filters CF1 may transmit the first light that is not converted by the wavelength conversion layer QDL from among the first light emitted from the light emitting element LE and may absorb or block the fourth light converted by the wavelength conversion layer QDL. Accordingly, each of the first emission areas EA1 may emit the first light.

Each of the second color filters CF2 may be disposed on the wavelength conversion layer QDL in the second emission area EA2. Each of the second color filters CF2 may transmit the second light and may absorb or block the first light and the third light. For example, each of the second color filters CF2 may transmit light of a green wavelength band and may absorb or block light of blue and red wavelength bands. Therefore, each of the second color filters CF2 may absorb or block the first light that is not converted by the wavelength conversion layer QDL from among the first light emitted from the light emitting element LE. In addition, each of the second color filters CF2 may transmit the second light corresponding to the green wavelength band from among the fourth light converted by the wavelength conversion layer QDL and may absorb or block the third light corresponding to the red wavelength band. Accordingly, each of the second emission areas EA2 may emit the second light.

Each of the third color filters CF3 may be disposed on the wavelength conversion layer QDL in the third emission area EA3. Each of the third color filters CF3 may transmit the third light and may absorb or block the first light and the second light. For example, each of the third color filters CF3 may transmit light of a red wavelength band and may absorb or block light of blue and green wavelength bands. Therefore, each of the third color filters CF3 may absorb or block the first light that is not converted by the wavelength conversion layer QDL from among the first light emitted from the light emitting element LE. In addition, each of the third color filters CF3 may transmit the third light corresponding to the red wavelength band from among the fourth light converted by the wavelength conversion layer QDL and may absorb or block the second light corresponding to the green wavelength band. Accordingly, each of the third emission areas EA3 may emit the third light.

In addition, at least a portion of the partition wall PW may include the same material as the light emitting elements LE. For example, because the partition wall PW may be formed by the same process as that of the light emitting elements LE, a manufacturing process may be simplified. Each of the color filters CF1, CF2, and CF3 may be disposed in the emission areas EA1, EA2, and EA3. In the embodiment shown in FIGS. 4 and 5, the top surfaces of the color filters CF1, CF2, and CF3 are aligned with the top surface of the light blocking member BM and the end portion of the reflective member RM in the first direction DR1, but the present disclosure is not limited thereto. The top surfaces of the color filters CF1, CF2, and CF3 may protrude or may be recessed in the third direction DR3 as compared to the top surface of the light blocking member BM and the end portion of the reflective member RM.

The reflective member RM according to an embodiment may be further disposed between the light blocking member BM and the color filters CF1, CF2, and CF3. For example, the reflective member RM positioned between the light blocking member BM and the partition wall PW may extend in the first direction DR1, and the reflective member RM positioned between the light blocking member BM and the color filters CF1, CF2, and CF3 may extend in the third direction DR3. The reflective member RM positioned between the light blocking member BM and the color filters CF1, CF2, and CF3 may be in direct contact with the light blocking member BM and the color filters CF1, CF2, and CF3 adjacent thereto.

The optical pattern LP may be disposed on the color filters CF1, CF2, and CF3 in the emission areas EA1, EA2, and EA3. The optical pattern LP may be directly disposed on the color filters CF1, CF2, and CF3. For example, the optical pattern LP may be directly disposed on the top surfaces of the color filters CF1, CF2, and CF3. The optical pattern LP may have a shape protruding in an upward direction (e.g., in a direction from the wavelength conversion layer QDL toward the color filters CF1, CF2, and CF3). For example, a cross-sectional shape of the optical pattern LP may be a lens shape that is upwardly convex. The optical pattern LP may be disposed on the color filters CF1, CF2, and CF3, the reflective member RM, and the light blocking member BM below the optical pattern LP. The optical pattern LP may be directly disposed on the color filters CF1, CF2, and CF3, the reflective member RM, and the light blocking member BM below the optical pattern LP. For example, a width of the optical pattern LP may be greater than a width (e.g., W3 in FIG. 8) of the color filters CF1, CF2, and CF3. However, the present disclosure is not limited thereto, and the width of the optical pattern LP may be equal to or smaller than the width (e.g., W3 in FIG. 8) of the color filters CF1, CF2, and CF3. The optical pattern LP may concentrate the first to third light transmitted through the color filters CF1, CF2, and CF3 in each of the emission areas EA1, EA2, and EA3. The arrangement of the plurality of optical patterns LP and the concentration of the first to third light of the optical pattern LP will be described in more detail with reference to FIG. 8.

Figure 8:
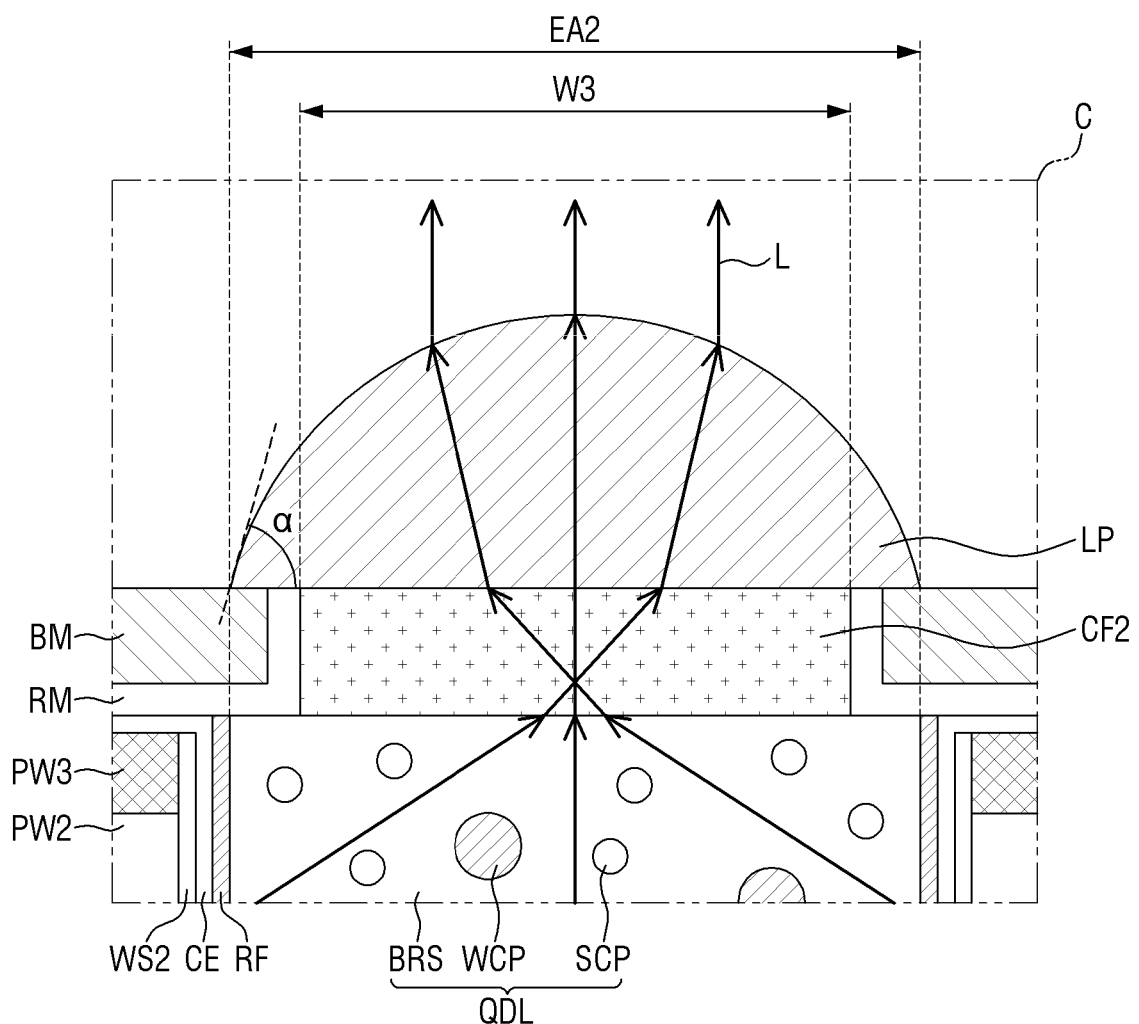
FIG. 8 is an enlarged cross-sectional view of the area C of FIG. 5.

FIG. 8 is an enlarged cross-sectional view of the area C of FIG. 5.

Referring to FIG. 8, the plurality of optical patterns LP may concentrate the first to third light transmitted through the color filters CF1, CF2, and CF3 in each of the emission areas EA1, EA2, and EA3. Hereinafter, for convenience of description, the first to third light will be collectively referred to as light L. As illustrated in FIGS. 4 and 8, the light L provided from the light emitting element LE may pass through the wavelength conversion layer QDL (where some of it is converted to the fourth light through the wavelength conversion particles WCP, scattered by the scattering particles SCP and some of it passes through the base resin BRS without being incident to the wavelength conversion particles WCP and the scattering particles SCP) to be provided to the second color filter CF2 or to be reflected by the reflective film RF and provided to the second color filter CF2.

A refractive index of the second color filter CF2 is greater than that of the base resin BRS, and as illustrated in FIG. 8, the light L may be refracted to such an extent that it is concentrated while passing through a boundary between the base resin BRS and the second color filter CF2. According to an embodiment, because the reflective member RM is disposed between the light blocking member BM and the partition wall PW and between the light blocking member BM and the color filters CF1, CF2, and CF3, the light L passing through the wavelength conversion layer QDL may not be absorbed by the light blocking member BM, thereby increasing light efficiency. In addition, as described above, because the light blocking member BM is disposed on the partition wall PW and is disposed to be further extended into the emission areas EA1, EA2, and EA3 (e.g., the width W2 of the light blocking member BM is greater than the width Wpw of the partition wall PW), and the reflective member RM is disposed to be further extended into the emission areas EA1, EA2, and EA3 (e.g., a portion of the reflective member RM is disposed in the emission areas EA1, EA2, and EA3), the width W3 of the second color filter CF2 may be smaller than the width of the second emission area EA2. For example, an area of the second emission area EA2 in which the light L is substantially provided to the optical pattern LP through the second color filter CF2 may be reduced. When the area of the second emission area EA2 in which the light L is substantially provided to the optical pattern LP through the second color filter CF2 is reduced, a light concentration degree may be increased in a process in which the light L is provided from the second color filter CF2 to the optical pattern LP. To increase the light concentration degree through the optical pattern LP, that is, in order to adjust the light L obliquely travelling in a lateral direction having a contained angle (e.g., a predetermined contained angle) with the upward direction (e.g., the third direction DR3) by the optical pattern LP in a lateral direction in which the contained angle with the upward direction DR3 is reduced by the optical pattern LP, a difference in refractive index of the optical pattern LP with the adjacent members and a shape of the optical pattern LP needs to be adjusted.

First, the refractive index of the optical pattern LP may be greater than that of the second color filter CF2 adjacent to the optical pattern LP. The light L obliquely travelling in the lateral direction having the contained angle with the upward direction DR3 from among the light L transmitted through the second color filter CF2 at an interface between the optical pattern LP and the second color filter CF2 may travel in the lateral direction in which the contained angle with the upward direction DR3 is reduced (e.g., concentrating light to the center of the second emission area EA2).

Further, when (e.g., only when) the refractive index of the optical pattern LP is adjusted to be greater than that of the second color filter CF2 and at the same time, a cross-sectional shape of the optical pattern LP is formed in a shape of a converging lens generally used for light concentration, the concentration of the light L transmitted through the second color filter CF2 to the central portion of the second emission area EA2 may be more reliably performed. In general, the converging lens is configured for when an initial angle α is 30 degrees or more. In the present specification, the initial angle is an angle between a tangent line at a contact point where a lower surface of the optical pattern LP in contact with the top surface of the second color filter CF2 and a convex surface of the optical pattern LP meet and a bottom surface of the optical pattern LP in contact with the top surface of the second color filter CF2 in, for example, FIG. 8. Hereinafter, an arrangement in a plan view between the emission areas EA1, EA2, and EA3 of the pixel (e.g., PX in FIG. 3), the light emitting elements LE, the color filters CF1, CF2, and CF3, the light blocking member BM, and the optical pattern LP will be described with reference to FIGS. 9A to 9D and FIG. 10.

FIGS. 9A to 9D are layout views illustrating a pixel, light emitting elements, color filters, and a light blocking member according to embodiments. FIG. 10 is a layout view illustrating pixels, light emitting elements, and optical patterns according to an embodiment.

Figure 9A:
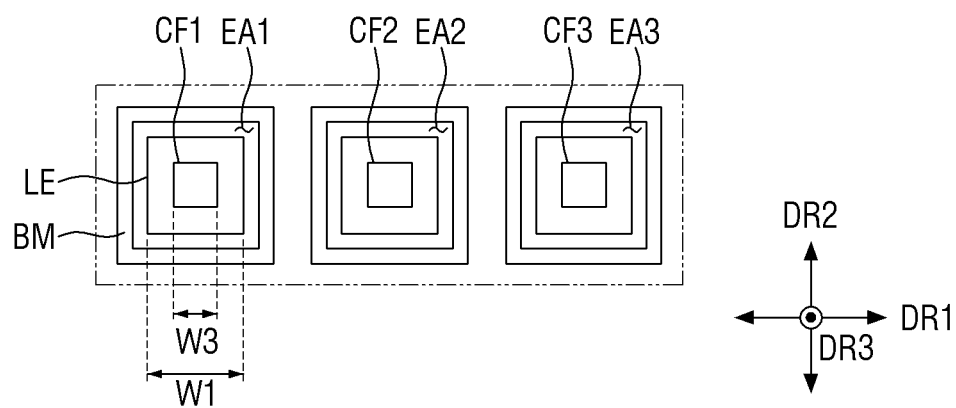
FIGS. 9A to 9D are layout views of a pixel, light emitting elements, color filters, and a light blocking member according to embodiments.
Figure 9B:
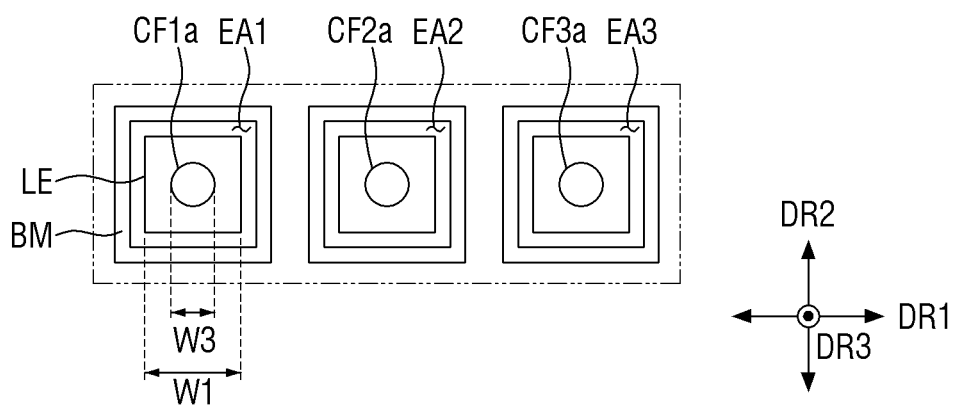
Figure 9C:
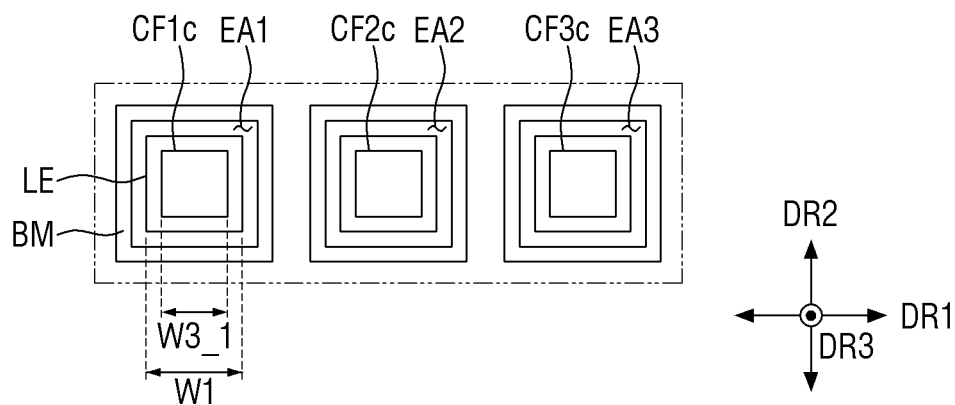
Figure 9D:
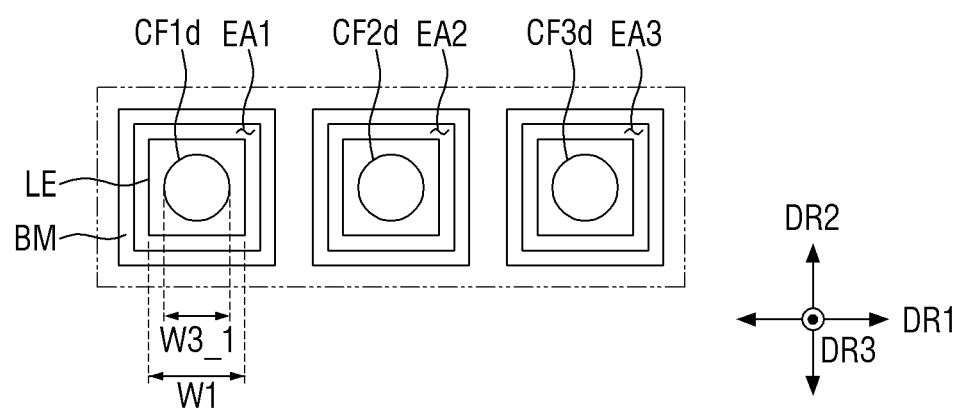
Figure 10:
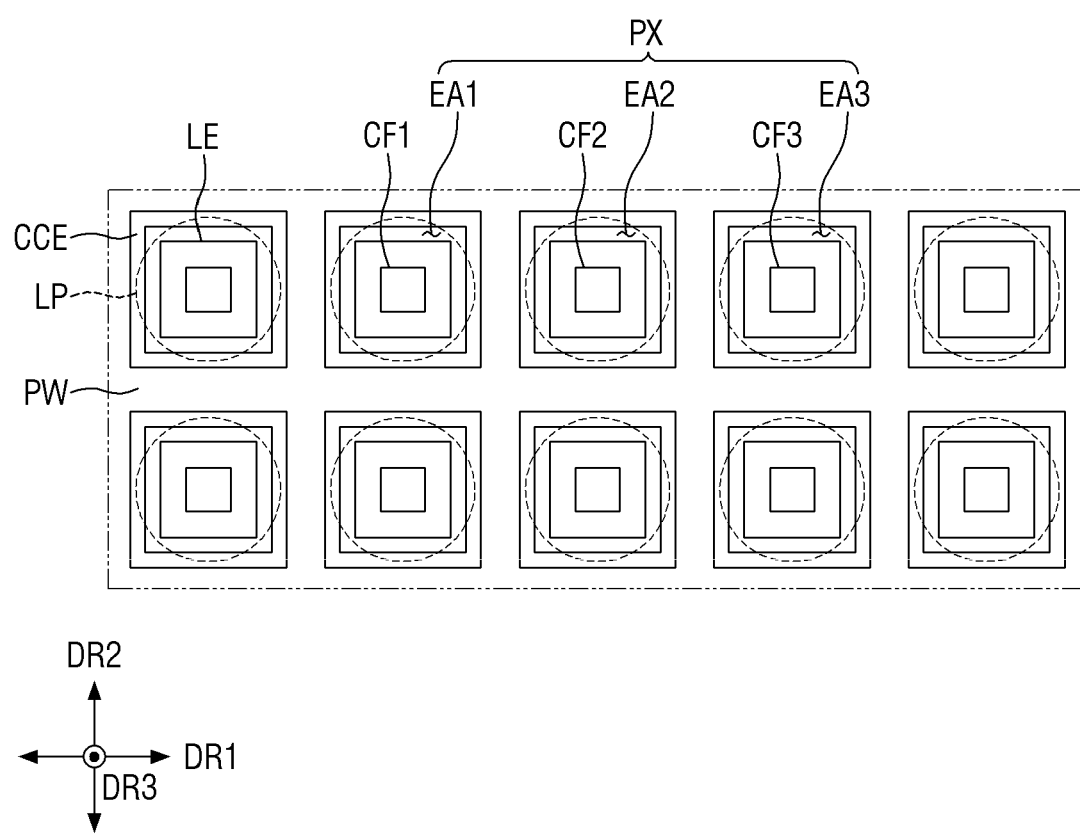
FIG. 10 is a layout view of pixels, light emitting elements, and optical patterns according to an embodiment.

FIGS. 9A and 9B illustrate embodiments in which a width (or diameter) W3 of the color filters CF1, CF2, and CF3 (or CF1a, CF2a, and CF3a) is 30% to 50% of a width W1 of the light emitting element LE, and FIGS. 9C and 9D illustrate embodiments in which a width (or diameter) W3_1 of the color filters CF1, CF2, and CF3 (or CF1d, CF2d, and CF3d) is 70% to 90% of the width W1 of the light emitting element LE. In addition, FIGS. 9A and 9C illustrate embodiments in which the color filters CF1, CF2, and CF3 (or CF1c, CF2c, and CF3c) have a rectangular or square shape in a plan view, and FIGS. 9B and 9D illustrate embodiments in which the color filters CF1, CF2, and CF3 (or CF1d, CF2d, and CF3d) have a circular or elliptical shape in a plan view.

As illustrated in FIG. 10, a shape of the optical pattern LP in a plan view may be a circular or elliptical, and the optical pattern LP may overlap the light emitting element LE and the color filters CF1, CF2, and CF3 in a plan view. The color filters CF1, CF2, and CF3 may be completely surrounded by the light blocking member BM in a plan view. The optical pattern LP, according to an embodiment, may be disposed in each of the emission areas EA1, EA2, and EA3. For example, a plurality of optical patterns LP may be provided, and the plurality of optical patterns LP may be disposed in each of the emission areas EA1, EA2, and EA3.

Hereinafter, other embodiments of the present disclosure will be described.

Figure 11:
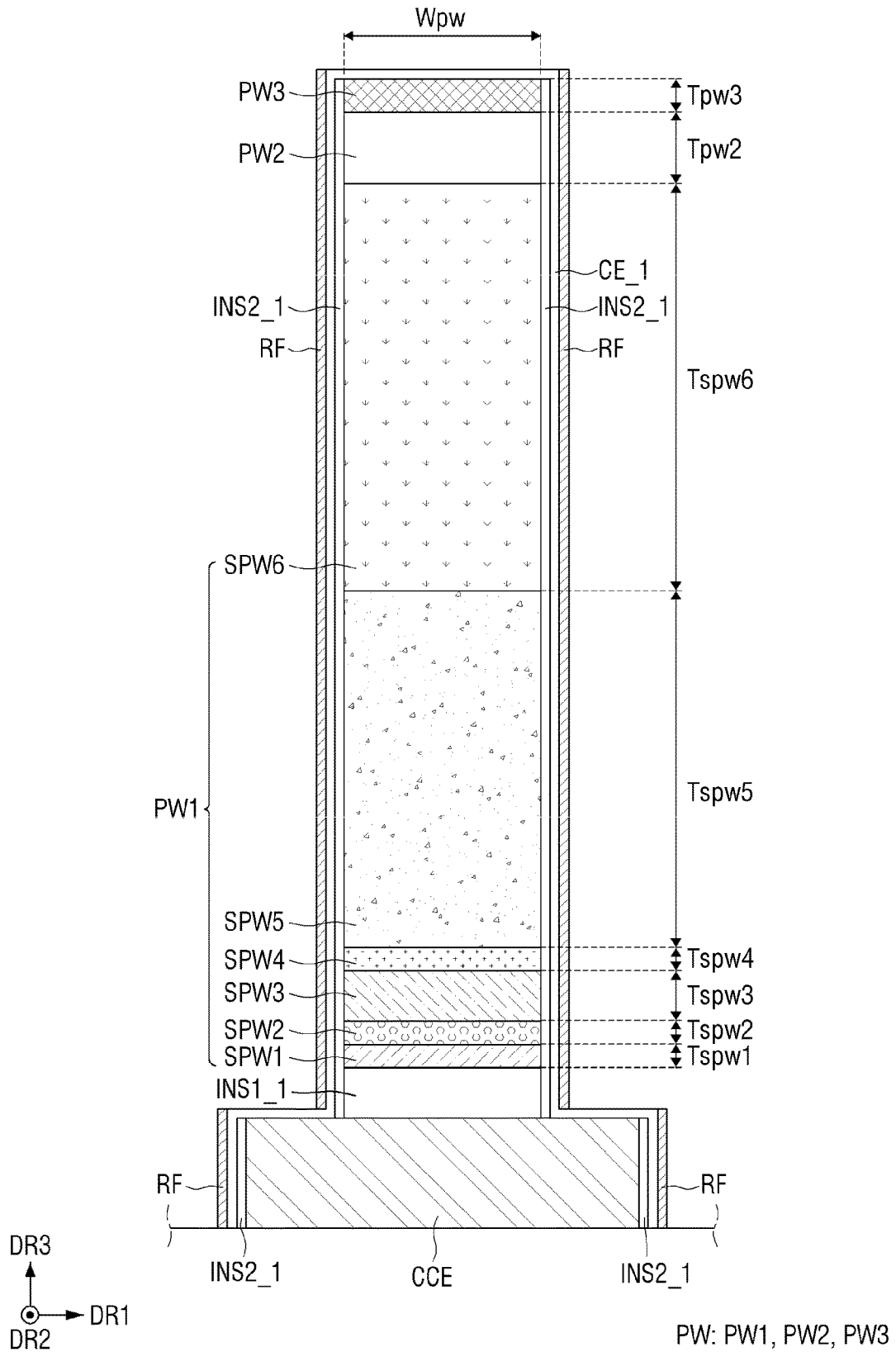
FIG. 11 is an enlarged cross-sectional view of another embodiment of the partition wall shown in FIG. 5.

FIG. 11 is an enlarged cross-sectional view of another the partition wall shown in FIG. 5 according to another embodiment.

The partition wall shown in FIG. 11 is different from the embodiment shown in FIG. 7 in that a first insulating layer INS1_1 completely covers the top surface of the common connection electrode CCE. Description of features and elements that are the same or substantially similar to features already described above with respect to FIGS. 5 and 7 will be omitted.

Referring to FIG. 11, the first insulating layer INS1_1 may be disposed on the top surface of the common connection electrode CCE. Because the first insulating layer INS1_1 completely covers the top surface of the common connection electrode CCE, the top surface of the common connection electrode CCE may not be exposed. Accordingly, the common electrode CE_1 may be in contact with a top surface of the first insulating layer INS1_1 and may not be in contact with the top surface of the common connection electrode CCE. In this embodiment, the common electrode CE_1 may be connected to a common voltage supply unit in the non-display area NDA to receive a common voltage.

A second insulating layer INS2_1 may be disposed on side surfaces of the first insulating layer INS1_1, and the reflective film RF may be disposed on a common electrode CE_1 disposed on the side surfaces of the first insulating layer INS1_1.

Figure 12:
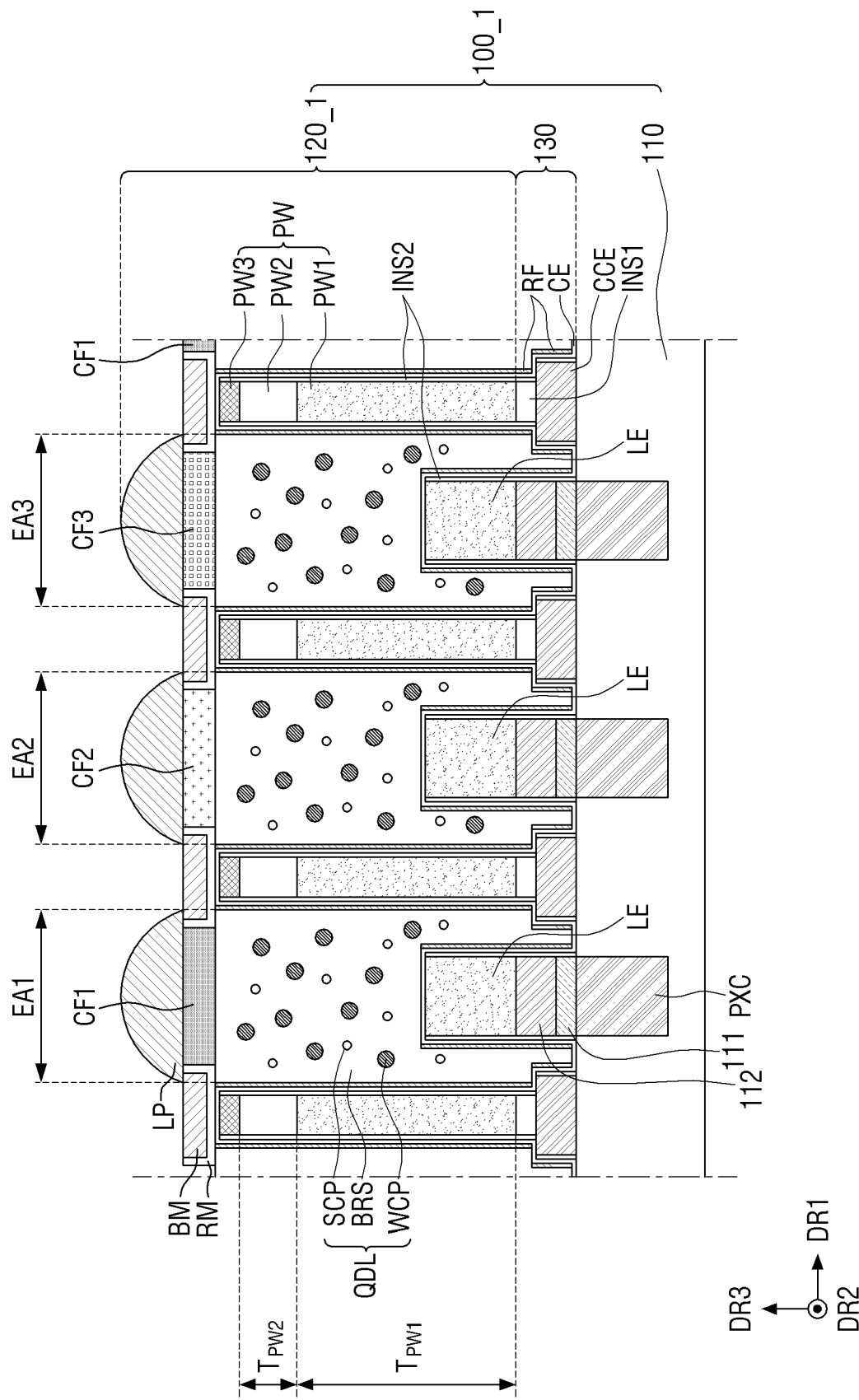
FIG. 12 is a cross-sectional view of a display panel according to another embodiment.

FIG. 12 is a cross-sectional view of a display panel according to another embodiment.

Referring to FIG. 12, a display panel 100_1 differs from the display panel 100 shown in FIG. 5 in that a light emitting element layer 120_1 thereof has a thickness of the base resin BRS and a thickness of the partition wall PW that are generally reduced. Because the thicknesses of the partition wall PW and the wavelength conversion layer QDL are reduced, a process time may be reduced.

Figure 13:
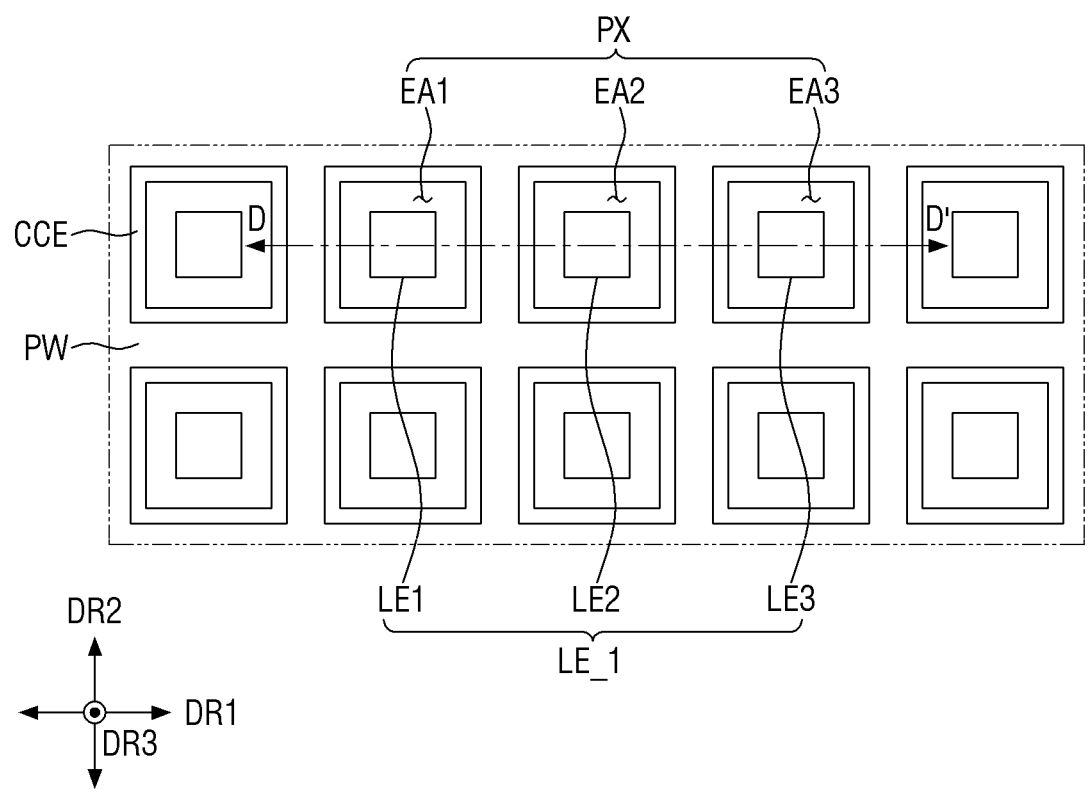
FIG. 13 is a layout view of pixels of a display panel according to still another embodiment.
Figure 14:
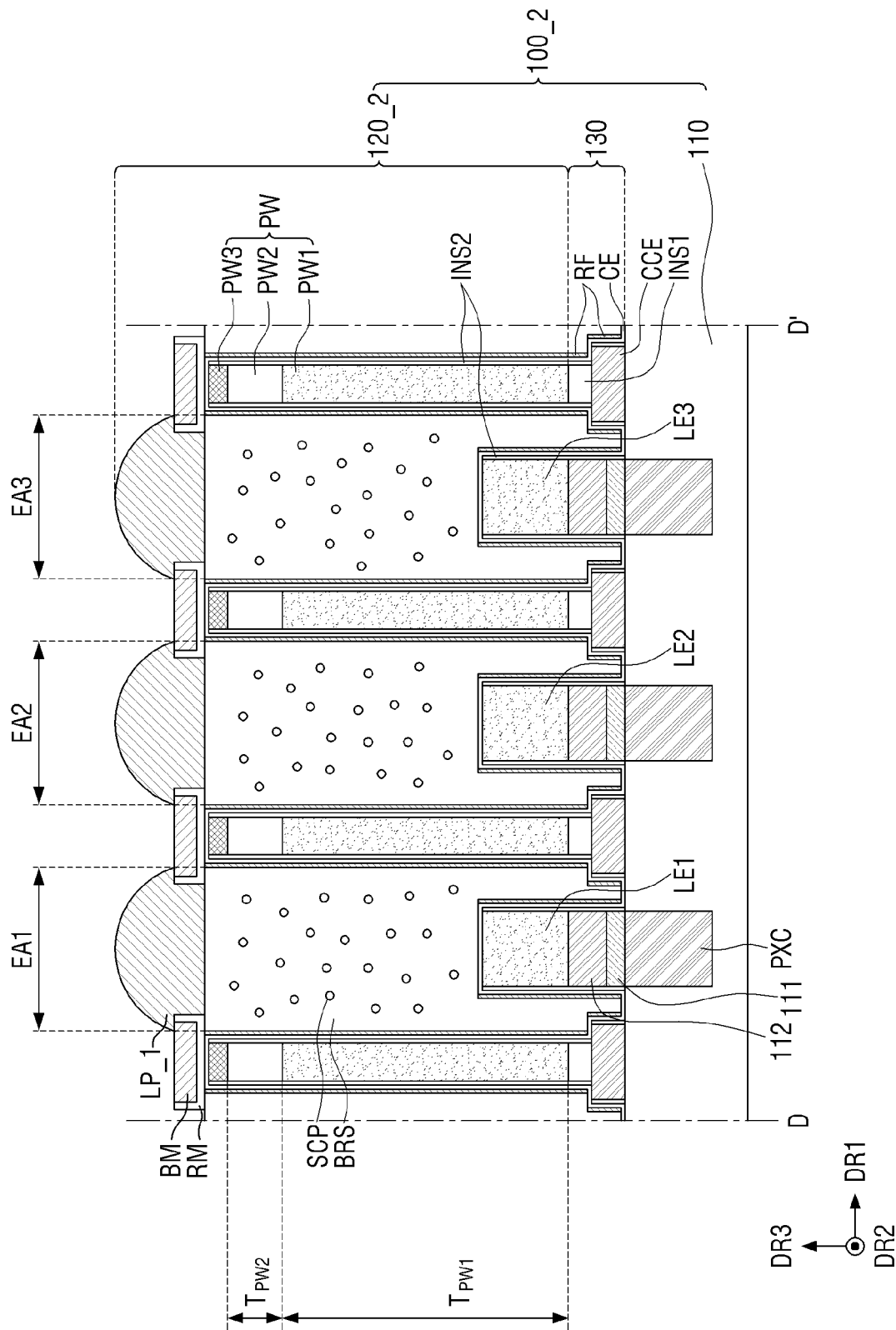
FIG. 14 is a cross-sectional view taken along the line D-D' of FIG. 13.

FIG. 13 is a layout view of pixels of a display panel according to another embodiment, and FIG. 14 is a cross-sectional view taken along the line D-D' of FIG. 13.

Referring to FIGS. 13 and 14, a display device differs from the display device shown in FIGS. 3 and 5 in that a light emitting element LE_1 thereof includes a first light emitting element LE1 for emitting first light, a second light emitting element LE2 for emitting second light, and a third light emitting element LE3 for emitting third light.

Because a light emitting element layer 120_2 of a display panel 100_2 according to the present embodiment has the light emitting elements LE1, LE2, and LE3 for emitting the first to third light, respectively, disposed for each of the emission areas EA1, EA2, and EA3, the wavelength conversion particles WCP of the wavelength conversion layer QDL described above in connection with FIG. 5 may be omitted. When the wavelength conversion particles WCP of the wavelength conversion layer QDL are omitted, only the base resin BRS and the scatterers SCP of the wavelength conversion layer QDL may be disposed in a space (or area) in which the wavelength conversion layer QDL shown in FIG. 5 is disposed. In some embodiments, the scatterers SCP may be (or may also be) omitted. The base resin BRS may also be referred to as a filling layer.

As illustrated in FIG. 14, the optical pattern LP_1 may be directly disposed on the base resin BRS. According to the present embodiment, the refractive index of the optical pattern LP_1 may be greater than that of the base resin BRS. As a result, the light transmitted through the base resin BRS may be concentrated.

Figure 15:
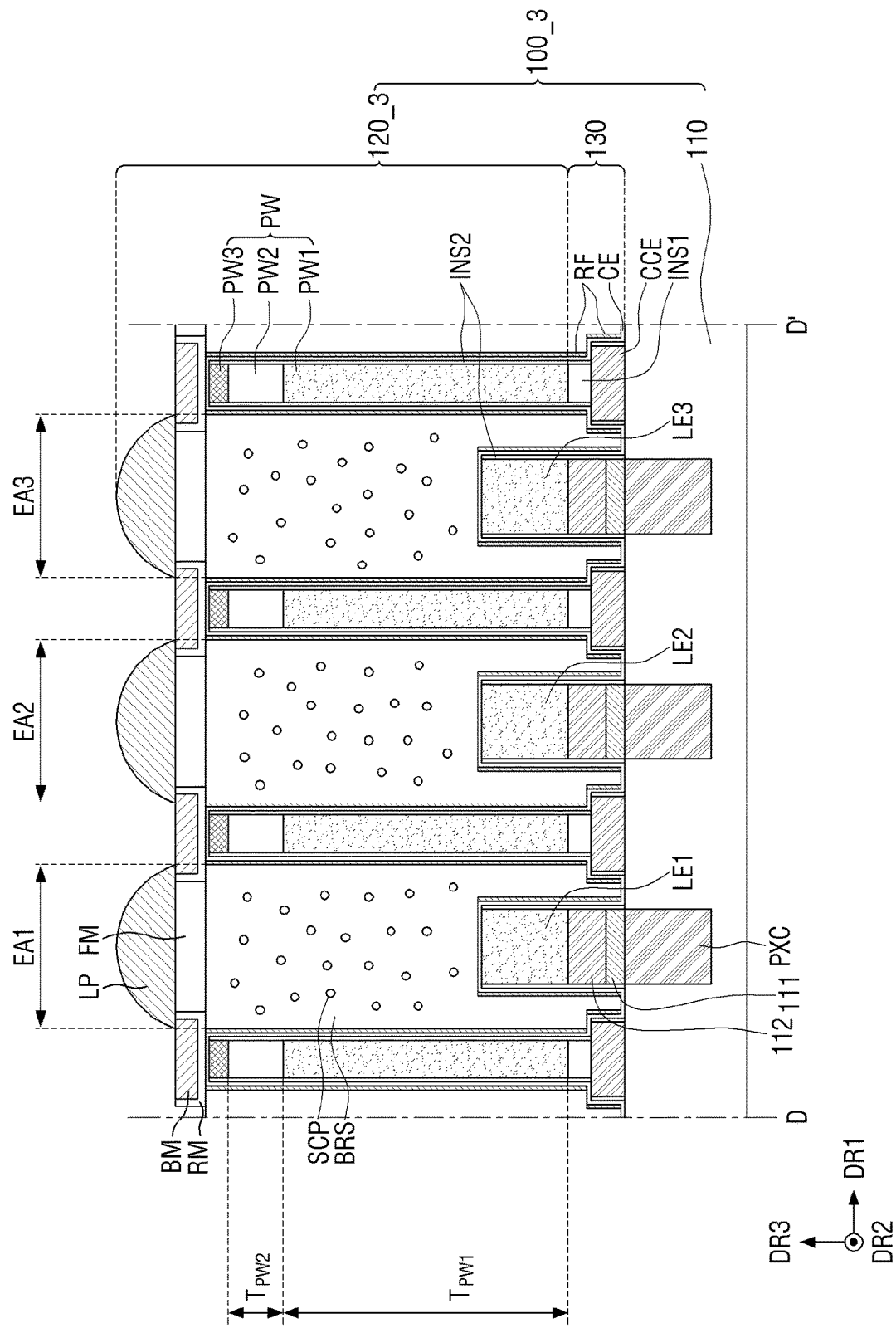
FIG. 15 is a cross-sectional view of a display panel according to another embodiment.

FIG. 15 is a cross-sectional view of a display panel according to another embodiment.

Referring to FIG. 15, a display panel 100_3 differs from the display panel 100_2 shown in FIG. 14 in that a light emitting element layer 120_3 thereof includes a filling member FM that is separately disposed between the base resin BRS and the optical pattern LP.

The light emitting element layer 120_3 of the display panel 100_3 according to the present embodiment may further include the filling member FM disposed between the base resin BRS and the optical pattern LP.

The filling member FM may be disposed in the areas in which the color filters CF1, CF2, and CF3 of the display panel 100 of FIG. 5 are disposed. For example, the filling member FM may be in direct contact with the upper surface of the base resin BRS, the bottom surface of the optical pattern LP, and the reflective member RM. A refractive index of the filling member FM may be greater than that of the base resin BRS. Because the refractive index of the filling member FM is greater than that of the base resin BRS, light concentration efficiency may be increased when the light travels from the base resin BRS to the filling member FM.

Descriptions of features and elements that are the same or substantially similar to those described above with reference to FIGS. 8 and 14 will be omitted.

Figure 16:
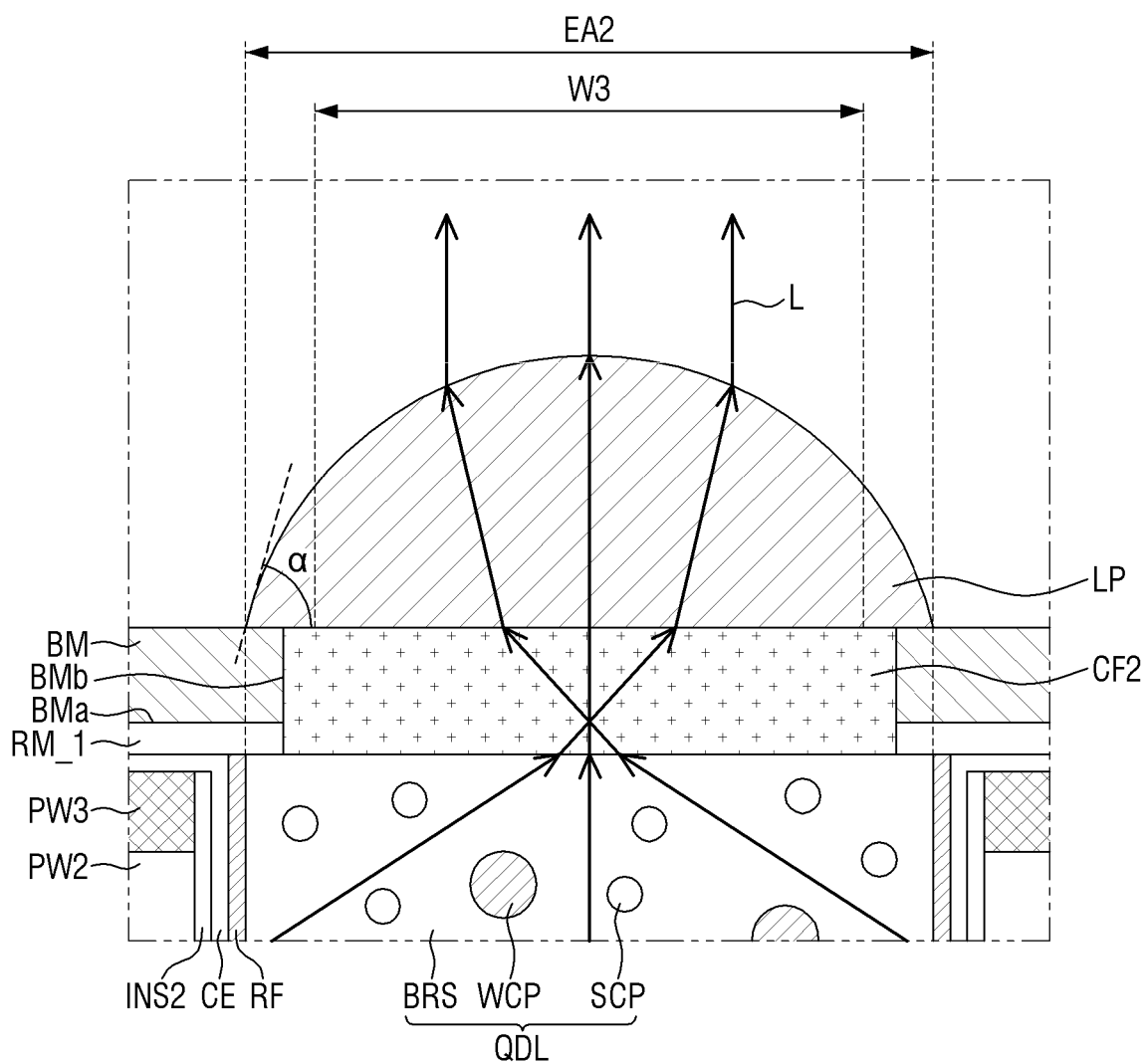
FIG. 16 is a cross-sectional view of a light blocking member and a reflective member according to another embodiment.

FIG. 16 is a cross-sectional view of a light blocking member and a reflective member according to another embodiment.

Referring to FIG. 16, a reflective member RM_1 differs from the reflective member RM shown in FIG. 8 in that the reflective member RM_1 is disposed only on a bottom surface BMa of the light blocking member BM and is not disposed on a side surface BMb.

The reflective member RM_1 may be disposed only on the bottom surface BMa of the light blocking member BM and may not be disposed on the side surface BMb thereof.

For example, the side surface BMb of the light blocking member BM may be in direct contact with the second color filter CF2.

Descriptions of features and elements that are the same or substantially similar to those described above with reference to FIG. 8 will be omitted.

Figure 17:
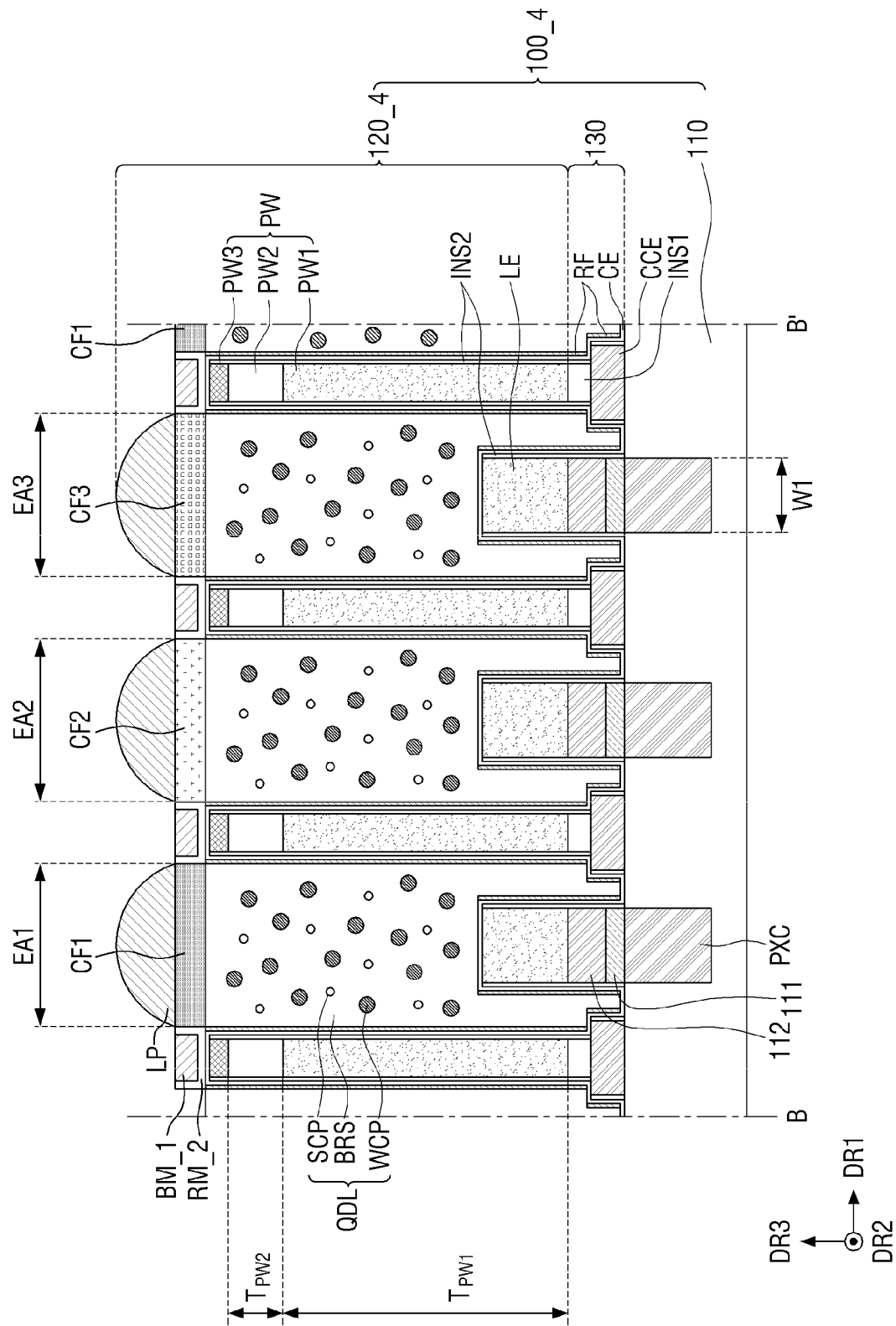
FIG. 17 is a cross-sectional view of a display panel according to another embodiment.

FIG. 17 is a cross-sectional view of a display panel according to another embodiment.

Referring to FIG. 17, a display panel 100_4 differs from the display panel 100 shown in FIG. 5 in that a light blocking member BM_1 of the light emitting element layer 120_4 overlaps the partition wall PW and is not positioned on the emission areas EA1, EA2, and EA3.

The light blocking member BM_1 of the display panel 100_4 according to the present embodiment may overlap the partition wall PW and may not be positioned in the emission areas EA1, EA2, and EA3. For example, a width of the light blocking member BM_1 may be substantially similar to the width Wpw of the partition wall PW. The reflective member RM_2 positioned on the bottom surface and the side surface of the light blocking member BM_1 may also not be positioned in the emission areas EA1, EA2, and EA3.

Descriptions of features and elements that are the same or substantially similar to those described above with reference to FIG. 5 will be omitted.

Figure 18:
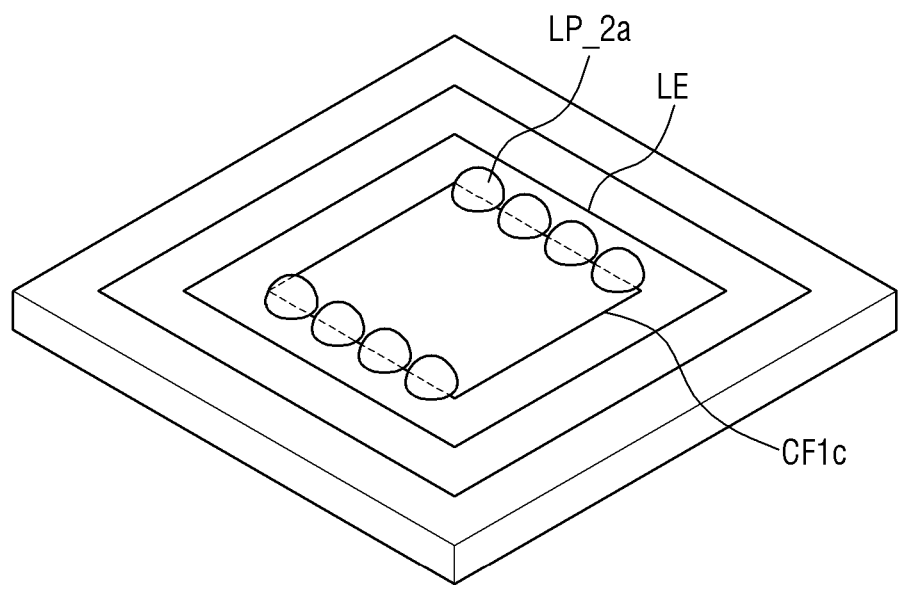
FIG. 18 is a layout view of a light emitting element and optical patterns according to another embodiment.
Figure 19A:
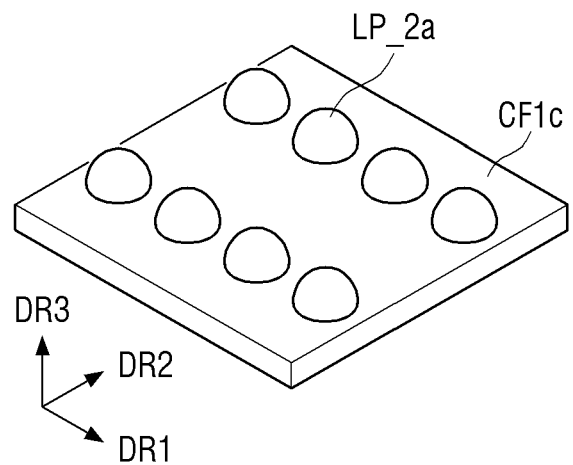
FIGS. 19A to 19E are perspective views of various embodiments of optical patterns.
Figure 19B:
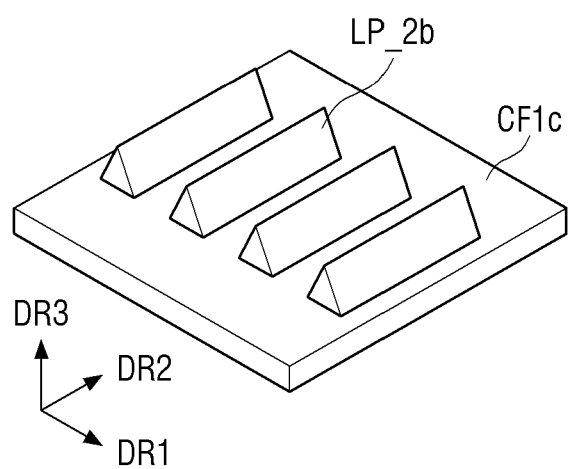
Figure 19C:
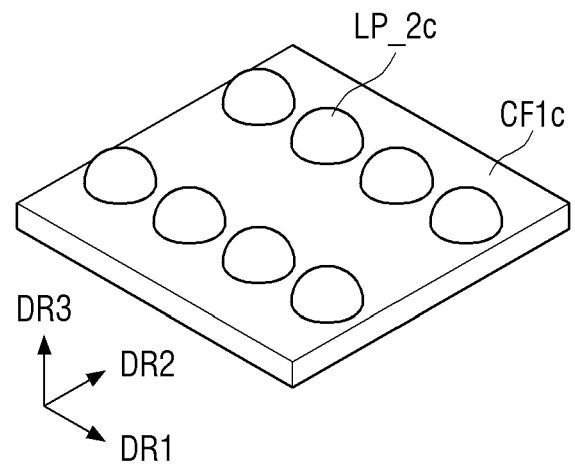
Figure 19D:
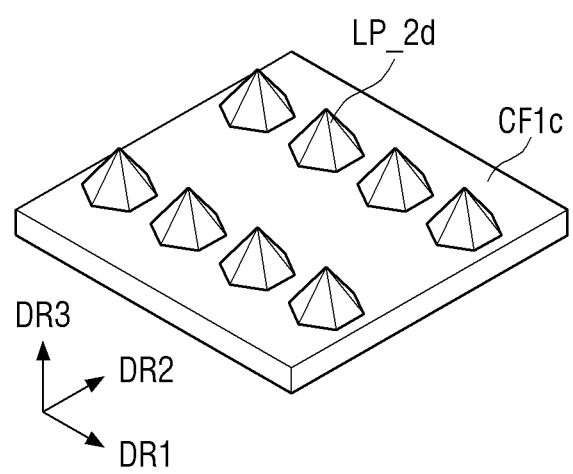
Figure 19E:
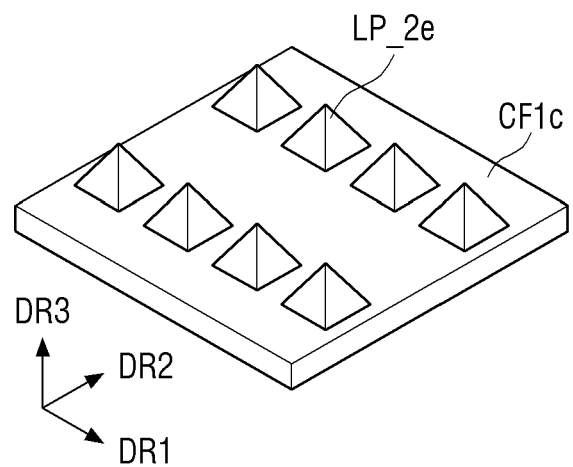

FIG. 18 is a layout view of a light emitting element and optical patterns according to another embodiment.

Referring to FIG. 18, an optical pattern LP_2a corresponding to one light emitting element LE differs from the optical pattern LP shown in FIG. 10 in that a plurality of optical patterns LP_2a may be provided.

A plurality of optical patterns LP_2a corresponding to one light emitting element LE according to the present embodiment may be provided.

In FIG. 18, for convenience of description, the plurality of optical patterns LP_2a are illustrated as being regularly arranged along the first direction (e.g., DR1 in FIG. 10) and the second direction (e.g., DR2 in FIG. 10), but they are not limited thereto, and the plurality of optical patterns LP_2a may be randomly arranged. Further, the number of the plurality of optical patterns LP_2a illustrated in FIG. 18 is four along the first direction DR1 and two along the second direction DR2, but the number of the plurality of optical patterns LP_2a is not limited thereto. The plurality of optical patterns LP_2a corresponding to one light emitting element LE may correspond to the embodiment in which the width W3_1 of each of the color filter CF1c, CF2c, and CF3c (or CF1d, CF2d, and CF3d) is 70% to 90% of the first width W1 of the corresponding light emitting element LE as illustrated in, for example, FIG. 9C or 9D. For example, as described above, and as illustrated in FIG. 9A or 9B, in an embodiment in which an area of the emission areas EA1, EA2, and EA3 in which the light is substantially provided to the optical pattern through the color filter is greatly reduced, because the optical pattern is disposed on the color filter, an amount of light provided from the color filter to the optical pattern itself may be reduced. In such an embodiment, when the plurality of optical patterns LP_2a are provided, an overlapping area of the color filter and the optical patterns LP_2a is reduced, and thus, light concentration by the optical patterns LP_2a may be reduced. However, in the present embodiment, as in FIG. 9C or 9D, in which the width W3 of each of the color filters CF1c, CF2c, and CF3c (or CF1d, CF2d, and CF3d) is 70% to 90% of the first width W1 of the corresponding light emitting element LE, because the area of the emission areas EA1, EA2, and EA3 in which the light is substantially provided to the optical pattern through the color filter is not greatly reduced, the light concentration by the optical patterns LP_2a may not be greatly reduced.

FIGS. 19A to 19E are perspective views of various modified embodiments of optical patterns.

Referring to FIGS. 19A to 19E, optical patterns LP_2a, LP_2b, LP_2c, LP_2d, and LP_2e may have a shape protruding in an upward direction DR3. The optical pattern LP_2a according to an embodiment shown in FIG. 19A may have a converging lens shape that is convex in the upward direction DR3, the optical pattern LP_2b shown in FIG. 19B may have a prism shape, and the plurality of optical patterns LP_2b may each extend along the second direction DR2 and may be arranged along the first direction DR1. The optical pattern LP_2c shown in FIG. 19C may have a spherical shape that is convex in the upward direction DR3. The optical pattern LP_2d shown in FIG. 19D may have a hexagonal pyramid shape that is convex in the upward direction DR3. The optical pattern LP_2e shown in FIG. 19E may have a quadrangular pyramid shape that is convex in the upward direction DR3.

Figure 20:
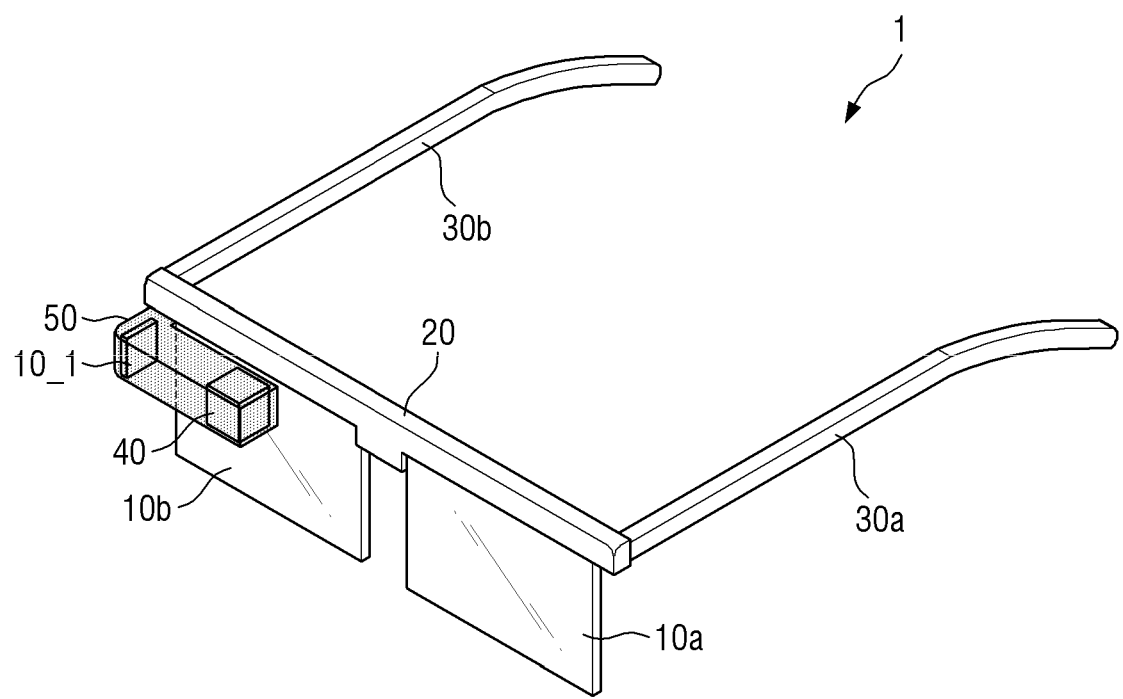
FIG. 20 is an illustrative view of a virtual reality device including the display device according to an embodiment.

FIG. 20 is an illustrative view of a virtual reality device including the display device according to an embodiment.

Referring to FIG. 20, a virtual reality device 1 according to an embodiment may be a glasses-type device. The virtual reality device 1 according to an embodiment may include the display device 10-1, a left eye lens 10a, a right eye lens 10b, a support frame 20, eyeglass frames legs 30a and 30b, a reflective member 40, and a display device accommodating part 50.

The virtual reality device 1 including the eyeglass frame legs 30a and 30b is illustrated in FIG. 20, but the virtual reality device 1 according to an embodiment may also be applied to a head mounted display including a head mounted band that may be mounted on a user's head instead of the eyeglass frame legs 30a and 30b. For example, the virtual reality device 1 according to an embodiment is not limited to that illustrated in FIG. 20 and may be applied in various forms to various other electronic devices.

The display device accommodating part 50 may include the display device 10_1 and the reflective member 40. An image displayed on the display device 10_1 may be reflected by the reflective member 40 and provided to a user's right eye through the right eye lens 10b. Accordingly, a user may view a virtual reality image displayed on the display device 10_1 through his/her right eye.

It has been illustrated in FIG. 20 that the display device accommodating part 50 is disposed at a right distal end of the support frame 20, but an embodiment of the present disclosure is not limited thereto. For example, the display device accommodating part 50 may be disposed at a left distal end of the support frame 20. In such an embodiment, an image displayed on the display device 10_1 may be reflected by the reflective member 40 and provided to a user's left eye through the left eye lens 10a. Accordingly, the user may view a virtual reality image displayed on the display device 10_1 through his/her left eye. In another embodiment, the display device accommodating parts 50 may be disposed at both the left and right distal ends of the support frame 20. In such an embodiment, the user may view a virtual reality image displayed on the display device 10_1 through both his/her left and right eyes.

Figure 21:
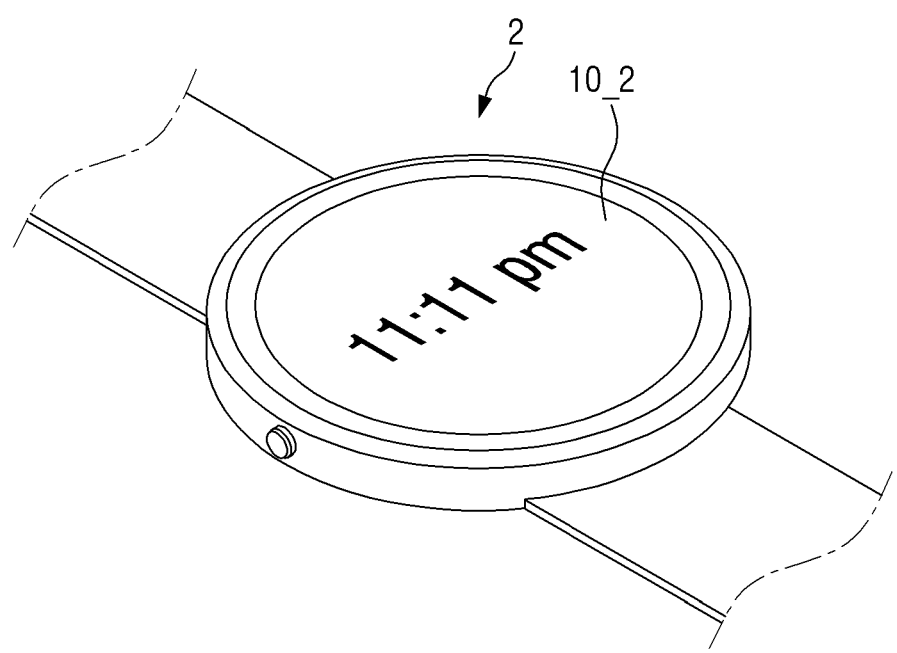
FIG. 21 is an illustrative view of a smart device including the display device according to an embodiment.

FIG. 21 is an illustrative view of a smart device including the display device according to an embodiment.

Referring to FIG. 21, a display device 10_2 according to an embodiment may be applied to a smart watch 2, which is one type of smart devices.

Figure 22:
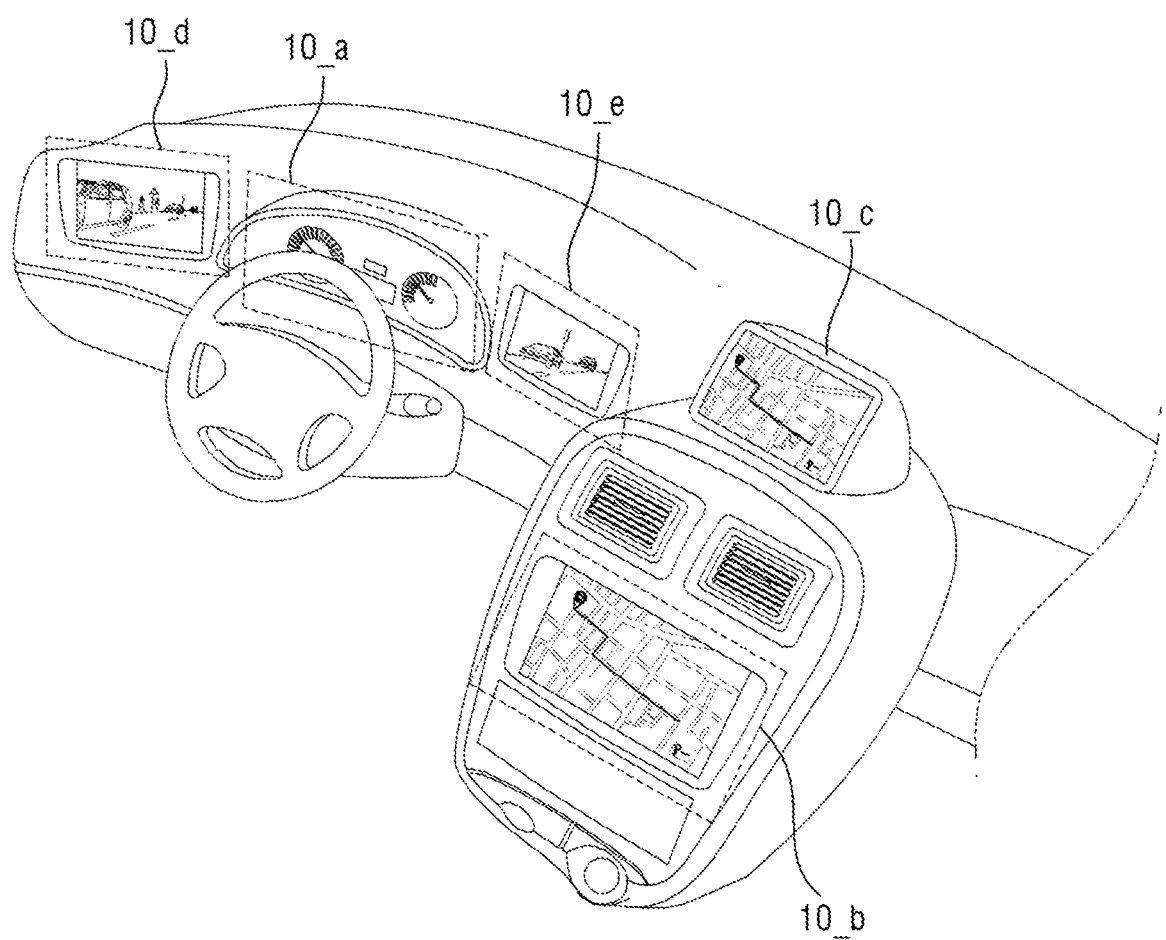
FIG. 22 is an illustrative view of an instrument board and a center fascia of a vehicle including display devices according to an embodiment.

FIG. 22 is an illustrative view of an instrument board and a center fascia of a vehicle including display devices according to an embodiment.

A vehicle to which display devices 10_a, 10_b, 10_c, 10_d, and 10_e according to an embodiment are applied is illustrated in FIG. 22.

Referring to FIG. 22, the display devices 10_a, 10_b, and 10_c according to an embodiment may be applied to an instrument board of the vehicle, applied to a center fascia of the vehicle, and/or applied to a center information display (CID) disposed on a dashboard of the vehicle. In addition, the display device 10_d and 10_e according to an embodiment may be applied to a room mirror display substituting for a side mirror of the vehicle.

Figure 23:
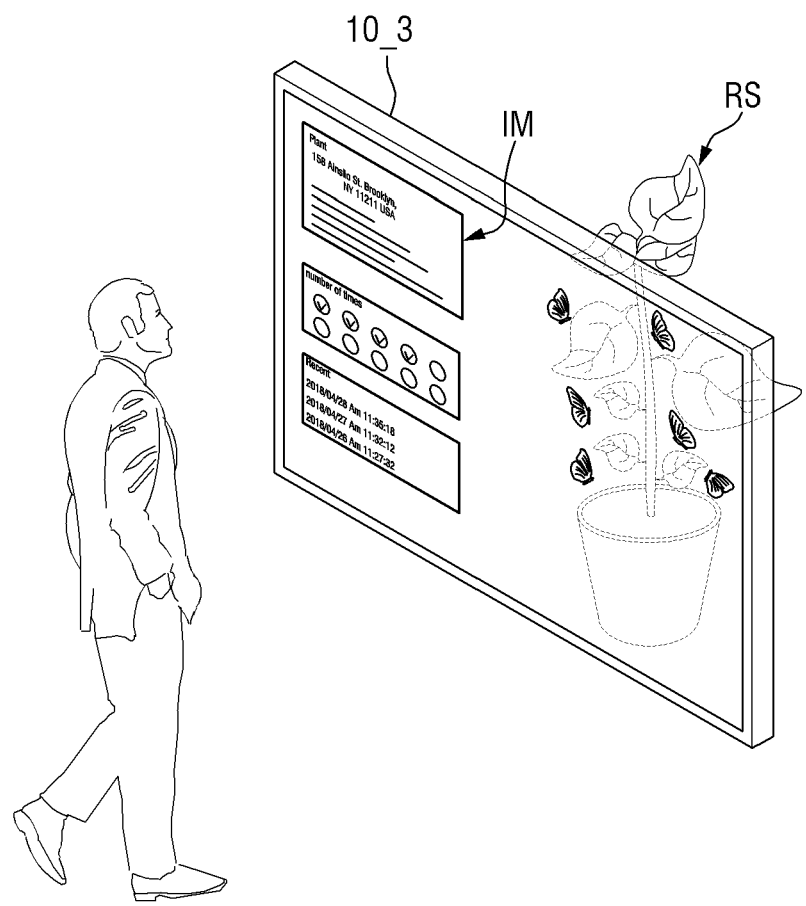
FIG. 23 is an illustrative view of a transparent display device including a display device according to an embodiment.

FIG. 23 is an illustrative view of a transparent display device including a display device according to an embodiment.

Referring to FIG. 23, a display device 10_3 according to an embodiment may be applied to a transparent display device. The transparent display device may transmit light while displaying an image IM. Therefore, a user positioned at a front surface of the transparent display device may not only view the image IM displayed on the display device 10_3, but may also see an object RS or a background positioned at a rear surface of the transparent display device. When the display device 10_3 is applied to the transparent display device, the base substrate BSUB of the display device illustrated in FIGS. 4 and 5 may include a light transmitting part capable of transmitting light or may be made of a material capable of transmitting light.

Although embodiments of the present disclosure have been disclosed herein for illustrative purposes, those skilled in the art will appreciate that various modifications, additions, and substitutions are possible without departing from the scope and spirit of the present disclosure as provided by the accompanying claims and their equivalents.

What is claimed is:

1. A display device comprising:
 a substrate;
 a partition wall on the substrate;
 a light emitting element in an emission area on the substrate and extending in a thickness direction of the substrate, the emission area being partitioned by the partition wall;
 a wavelength conversion layer on the light emitting element in the emission area, the wavelength conversion layer comprising a base resin and wavelength conversion particles dispersed in the base resin, the wavelength conversion particle being configured to convert a wavelength of light emitted from the light emitting element;
 a light blocking member on the partition wall;
 a reflective member between the light blocking member and the partition wall; and
 an optical pattern on the wavelength conversion layer in the emission area, the optical pattern protruding in an upward direction away from the substrate.

2. The display device of claim 1, wherein the light blocking member extends into the emission area.

3. The display device of claim 2, wherein a width of the light blocking member is greater than a width of the partition wall.

4. The display device of claim 2, wherein the reflective member is on a side surface of the light blocking member.

5. The display device of claim 4, wherein the reflective member is in direct contact with the light blocking member.

6. The display device of claim 4, further comprising a color filter between the optical pattern and the wavelength conversion layer.

7. The display device of claim 6, wherein a width of the optical pattern is greater than a width of the light emitting element.

8. The display device of claim 7, wherein the optical pattern is in direct contact with a top surface of the light blocking member, the reflective member, and the color filter.

9. The display device of claim 1, wherein a cross-sectional shape of the optical pattern is an upwardly convex lens shape, and
 wherein an initial angle of the lens shape is 30 degrees or more.

10. The display device of claim 1, wherein the partition wall comprises a first partition wall,
 wherein at least a partial area of the first partition wall has the same material as the light emitting element.

11. The display device of claim 10, wherein the light emitting element comprises a first semiconductor layer; an active layer on the first semiconductor layer; and a second semiconductor layer on the active layer.

12. The display device of claim 11, wherein the first partition wall comprises a first sub partition wall having the same material as that of the first semiconductor layer, a second sub partition wall having the same material as that of the active layer, and a third sub partition wall having the same material as that of the second semiconductor layer.

13. The display device of claim 12, wherein a thickness of the third sub partition wall is greater than or equal to a thickness of the second semiconductor layer.

14. The display device of claim 12, wherein the first partition wall further comprises a fourth sub partition wall on the third sub partition wall and comprising an undoped semiconductor material.

15. The display device of claim 14, wherein a thickness of the fourth sub partition wall is greater than a thickness of the second semiconductor layer.

16. The display device of claim 11, wherein the partition wall further comprises:
   a second partition wall on the first partition wall and comprising an insulating material; and
   a third partition wall on the second partition wall and comprising a conductive material, and
   wherein a thickness of the second partition wall is greater than a thickness of the third partition wall.

17. A display device comprising:
   a first emission area for emitting first light, a second emission area for emitting second light, and a third emission area for emitting third light, the first, second, and third emission areas being disposed in a display area of a substrate;
   a partition wall partitioning the first emission area, the second emission area, and the third emission area;
   a first light emitting element in the first emission area, a second light emitting element in the second emission area, and a third light emitting element in the third emission area, the first, second, and third light emitting elements extending in a thickness direction of the substrate;
   a filling layer on the first light emitting element in the first emission area, the second light emitting element in the second emission area, and the third light emitting element in the third emission area;
   a light blocking member on the partition wall;
   a reflective member between the light blocking member and the partition wall; and
   an optical pattern on the filling layer in the first, second, and third emission areas, the optical pattern having a shape protruding in an upward direction away from the substrate.

18. The display device of claim 17, wherein the optical pattern is directly on the filling layer.

19. The display device of claim 17, wherein the light blocking member extends into the first, second, and third emission areas, and
   wherein a width of the light blocking member is greater than a width of the partition wall.

20. The display device of claim 19, wherein the reflective member is on a side surface of the light blocking member, and
   wherein the reflective member is in direct contact with the light blocking member.

* * * * *